US005635409A

United States Patent [19]
Moslehi

[11] Patent Number: 5,635,409
[45] Date of Patent: Jun. 3, 1997

[54] REAL-TIME MULTI-ZONE SEMICONDUCTOR WAFER TEMPERATURE AND PROCESS UNIFORMITY CONTROL SYSTEM

[75] Inventor: Mehrdad M. Moslehi, Dallas, Tex.

[73] Assignee: Texas Instruments Incorporated, Dallas, Tex.

[21] Appl. No.: 331,309

[22] Filed: Oct. 28, 1994

Related U.S. Application Data

[63] Continuation of Ser. No. 703,078, May 20, 1991, Pat. No. 5,436,172.
[51] Int. Cl.$^6$ .................................................. H01L 21/00
[52] U.S. Cl. ............................. 438/7; 374/124; 374/128; 250/341.4; 438/16
[58] Field of Search ...................... 437/8, 247, 7; 250/341.1, 341.2, 341.4, 341.5, 341.6, 341.7, 341.8, 370.15; 374/120, 124, 128, 129, 137

[56] References Cited

U.S. PATENT DOCUMENTS

| | | | |
|---|---|---|---|
| 5,114,242 | 5/1992 | Gat et al. | 374/128 |
| 5,118,947 | 6/1992 | Hamashima et al. | 250/370.15 |
| 5,156,461 | 10/1992 | Moslehi | 374/121 |
| 5,308,161 | 5/1994 | Stein | 250/341.4 |

OTHER PUBLICATIONS

Band, "Temperature Measurements of Glass Substrates during Plasma Etching", J. Vac. Sci. Tech., 18(2), Mar. 1981, pp. 335–338.

Moslehi et al, "Rapid Thermal Nitridation of $SiO_2$ for Nitroxide Thin Dielectrics", Appl. Phys. Lett., 47(10), Nov. 15, 1985, pp. 1113–1115.

Moslehi et al, "Compositional Studies of thermally Nitrides Silicon Dioxide (Nitroxide)", Solid-State Science and Technology, Sep. 1985 pp. 2189–2719.

Moslehi et al, "Interfacial and Breakdown Characteristics of MOS Devices with Rapidly Grown Ultrathin $SiO_2$ Gate Insulators,", IEEE Trans. on Elec. Dev. No. 6, Jun. 1987, pp. 1407–1410.

Moslehi et al, "Thin $O_2$ Insulators Grown by Rapid Thermal oxidation of Silicon", Appl. Phys. Lett, 47(12), Dec. 15, 1985, pp. 1353–1355.

Moslehi et al, "Linearly Ramped Temperature Transient Rapid Thermal Oxidation of Silicon", Appl. Phy Lett, 53(12), Sep. 19, 1988, pp. 1104–1106.

Moslehi, "Single Wafer Optical Processing of Semiconductors: Thin Insulator Growth for Integral Electronic Device Applications," Appl. Phys. Lett. 1988, pp. 255–273.

Guurecsek, "A Model for Rapid Thermal Processing", IEEE Transactions on Semiconductor Manufacturing, vol. 2, No. 4, pp. 130–140, Nov. 1989.

*Primary Examiner*—John Niebling
*Assistant Examiner*—Thomas G. Bilodeau
*Attorney, Agent, or Firm*—W. James Brady, III; Richard L. Donaldson

[57] ABSTRACT

A real-time multi-zone semiconductor wafer temperature and process uniformity control system for use in association with a semiconductor wafer fabrication reactor comprises a multi-zone illuminator (130), a multi-point temperature sensor (132), and process control circuitry (150). The method and system of the invention significantly improved wafer (60) temperature control and process uniformity. The multi-zone illuminator module (130) selectively and controllably heats segments of the semiconductor wafer (60). Multi-point temperature sensor (132) independently performs pyrometry-based temperature measurements of predetermined points of the semiconductor wafer (60). Process control circuitry (150) operates in association with the multi-zone illuminator (130) and the multi-point temperature sensor (132) for receiving the temperature measurements and selectively controlling the illuminator module to maintain uniformity in the temperature measurements. A scatter module (116) also provides input to process control circuitry (150) for real-time emissivity compensation of the pyrometry-based temperature measurements of semiconductor wafer (60).

12 Claims, 13 Drawing Sheets

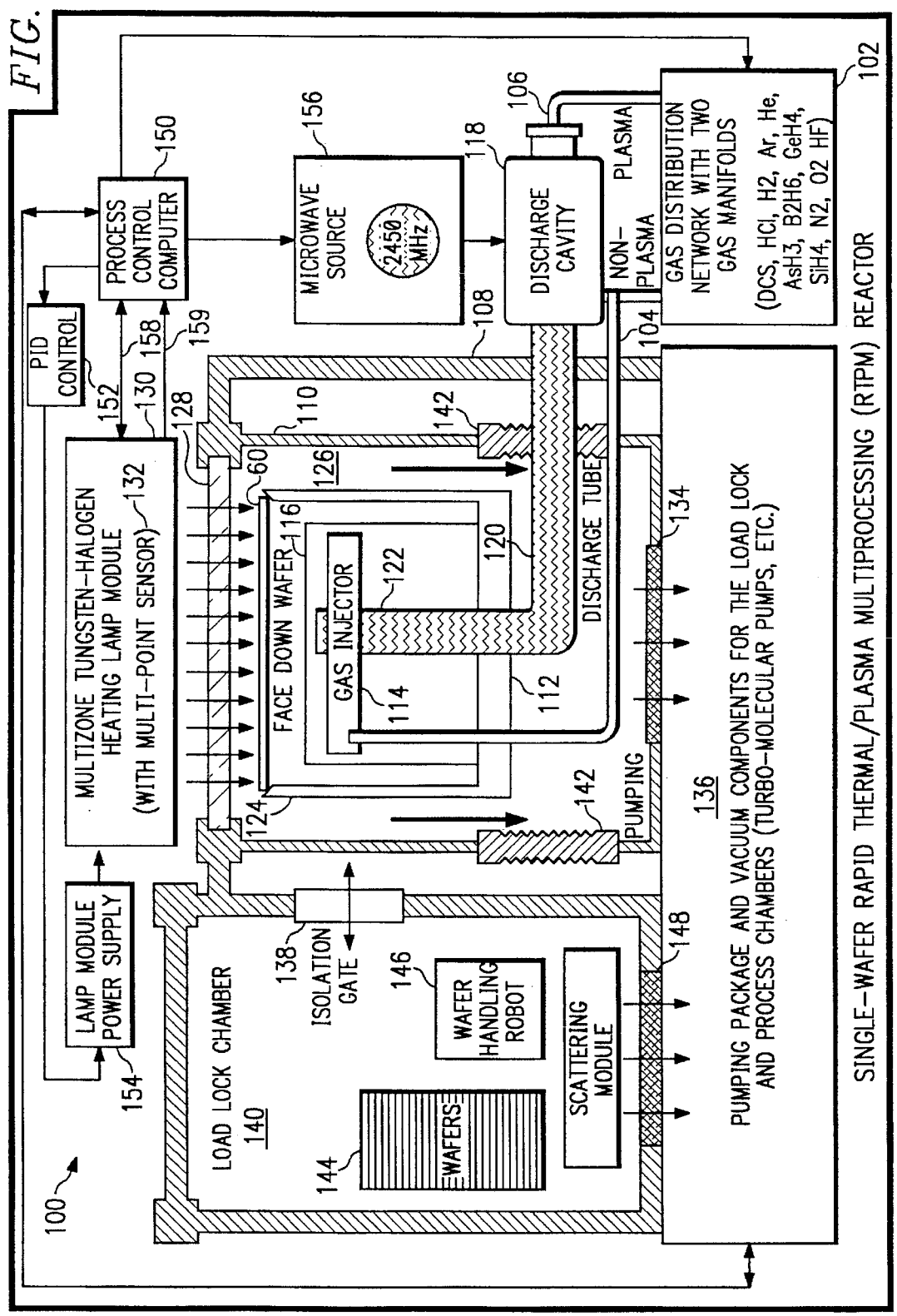

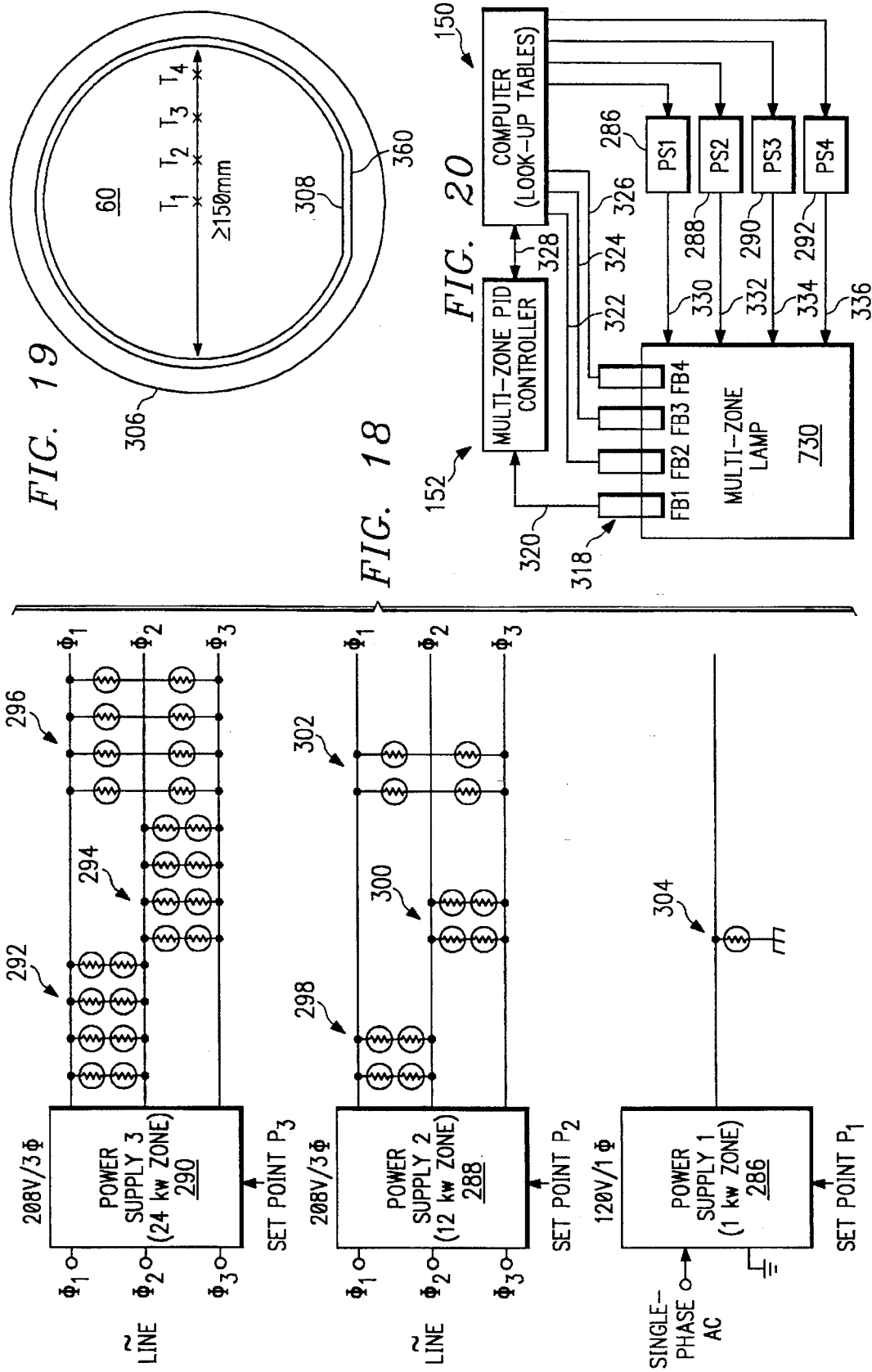

FIG. 21

| MASTER PS$_4$ (%) | SLAVED ZONES | | |
|---|---|---|---|
| | PS$_1$ | PS$_2$ | PS$_3$ |
| 0 | 0 | 0 | 0 |
| 5 | X$_1$ | Y$_1$ | Z$_1$ |
| 10 | X$_2$ | Y$_2$ | Z$_2$ |
| 15 | X$_3$ | Y$_3$ | Z$_3$ |
| 20 | X$_4$ | Y$_4$ | Z$_4$ |
| 25 | X$_5$ | Y$_5$ | Z$_5$ |
| 30 | X$_6$ | Y$_6$ | Z$_6$ |
| 35 | X$_7$ | Y$_7$ | Z$_7$ |
| 40 | X$_8$ | Y$_8$ | Z$_8$ |
| 45 | X$_9$ | Y$_9$ | Z$_9$ |
| 50 | X$_{10}$ | Y$_{11}$ | Z$_{11}$ |
| 55 | X$_{12}$ | Y$_{12}$ | Z$_{12}$ |
| 60 | X$_{13}$ | Y$_{13}$ | Z$_{13}$ |
| 65 | X$_{14}$ | Y$_{14}$ | Z$_{14}$ |
| 70 | X$_{15}$ | Y$_{15}$ | Z$_{15}$ |
| 75 | X$_{16}$ | Y$_{16}$ | Z$_{16}$ |
| 80 | X$_{17}$ | Y$_{17}$ | Z$_{17}$ |
| 85 | X$_{18}$ | Y$_{18}$ | Z$_{18}$ |
| 90 | X$_{19}$ | Y$_{19}$ | Z$_{19}$ |
| 95 | X$_{20}$ | Y$_{20}$ | Z$_{20}$ |
| 100 | X$_n$ | Y$_n$ | Z$_n$ |

NORMALIZED MASTER ZONE POWER SETTING IN % OF MAXIMUM POWER

SLAVE ZONE SETTINGS FOR OPTIMUM TEMPERATURE UNIFORMITY (X$_i$, Y$_i$, Z$_i \leq 100\%$)

REAL-TIME MULTI-ZONE SEMICONDUCTOR WAFER TEMPERATURE AND PROCESS UNIFORMITY CONTROL SYSTEM

This is a continuation, of application Ser. No. 07/703,078, filed May 20, 1991 now U.S. Pat. No. 5,436,172.

TECHNICAL FIELD OF THE INVENTION

The present invention relates to microelectronic device processing and more particularly to a real-time multi-zone semiconductor wafer process temperature and distribution uniformity control system for use in association with a semiconductor wafer fabrication reactor for improved wafer process temperature control and uniformity for a wide range of single-wafer lamp-heated device processing applications using advanced multi-zone lamp heating modules.

BACKGROUND OF THE INVENTION

Single-wafer optical processing of semiconductors is a powerful and versatile technique for fabrication of very-large-scale integrated (VLSI) and ultra-large-scale integrated (ULSI) electronic devices. It combines low thermal mass photon-assisted rapid wafer heating with reactive ambient semiconductor processing. Both the wafer temperature and the process environment can be quickly changed (because of short transient times) and, as a result, each fabrication step and its sub-processes can be independently optimized in order to improve the overall electrical performance of the fabricated devices.

Rapid thermal processing (RTP) of semiconductor wafers provides a capability for better wafer-to-wafer process repeatability in a single-wafer lamp-heated thermal processing reactor. Numerous silicon fabrication technologies can use RTP techniques, including thermal oxidation, nitridation, dopant diffusion, and different types of thermal anneals. Refractory metal silicide formation and chemical-vapor deposition (CVD) are other significant silicon device fabrication processes that can benefit from RTP in a single-wafer reactor. For example, CVD processes to form dielectrics (e.g., oxides and nitrides) and semiconductive materials such as amorphous silicon and polysilicon, as well as conductors (e.g., aluminum, copper, tungsten, and titanium nitride), can be performed using advanced RTP techniques for VLSI and ULSI device fabrication.

Known lamp sources for achieving these types of processes are shown in FIGS. 1 and 2. FIG. 1 shows a cold-wall system employed for rapid thermal processing of silicon that uses a single high-power low-pressure xenon arc lamp as the wafer heating energy source. The system of FIG. 1 employs a known rapid thermal processor chamber 30. The illuminator source is a single, low-pressure long xenon arc lamp 32 isolated from the reactor chamber 34 by a quartz optical window 36. A reflector 38 is used for optimal beam shaping to provide uniform wafer heating. Closed-loop wafer temperature control is performed via an optical pyrometer 40. Semiconductor wafer 42 rests on pins 43 within process chamber 34.

For further illustration, FIG. 2 illustrates another known RTP system 44 for semiconductor wafer processing. The system 44 of FIG. 2 uses two banks 46 and 48 of lamps 50 which are arranged in orthogonal or crossed directions. The lamps are placed outside the reactor chamber 52 quartz windows 54. Reflectors 56 and 58 are placed behind lamp banks 46 and 48, respectively. Quartz suscepter 62 holds semiconductor wafer 60. Semiconductor wafer 60 top and bottom surfaces face lamp banks 46 and 48. Relative power to each lamp 50 can be set and overall power can be controlled to maintain desired temperature by computer lamp controller 64. Computer lamp controller 64 receives temperature signal input from pyrometer 66. Rotary pump vacuum manifold 68 and gas manifold 70 operate to maintain process chamber 52 environment for various processes.

In the conventional RTP systems, such as those shown in FIGS. 1 and 2, equipment manufacturers have spent significant design resources to insure that the illuminator designs provide uniform wafer heating during steady-state conditions. These known systems are designed with illuminators which provide single-zone or very limited multi-zone control capability. Thus, with an increase or decrease of the power to the illuminator, the entire wafer temperature distribution is affected. As a result, there are insufficient real-time control capabilities to adjust or optimize wafer temperature uniformity during the steady-state and dynamic transient heat-up and cool-down cycles. Although known systems can provide some degree of wafer temperature uniformity under steady-state conditions, those systems do not insure wafer temperature uniformity during transient heat-up and cool-down periods. As a result, the transient heat-up or cool-down process segments can result in formation of slip dislocations (at high temperatures, e.g., $\geq 850°$ C.) as well as process nonuniformities. Moreover, known RTP systems do not provide a sufficient capability to adjust or optimize wafer temperature uniformity during the transient conditions over extended temperature ranges. Various process parameters can influence and degrade the RTP uniformity. Known RTP systems are optimized to provide steady-state temperature uniformity at a fixed pressure such as atmospheric process pressure. Thus, a change in process pressure as well as gas flow rates can degrade the RTP uniformity.

The cross-lamp configuration of FIG. 2 attempts to provide some limited level of real-time uniformity control for steady-state and transient heating conditions. The two-bank cross-lamp configuration of FIG. 2, however, does not provide sufficient flexibility to optimize semiconductor wafer temperature uniformity during the transient heat-ups and cool-downs as well as steady-state heating conditions. One particular disadvantage of the cross-lamp configuration of FIG. 2 is that while the semiconductor wafer is circular, the cross-lamp illuminator and its associated light rays do not possess any cylindrical symmetry. Thus, changing the output power of one of the lamp banks (or a subset of the lamps in one of the lamp banks) in order to modify the temperature on a specified region of wafer may cause detrimental non-uniformity effects on other areas of the semiconductor wafer. Moreover, the two banks within the cross-lamp configuration are strongly coupled to one another and this further limits flexibility in attempting to adjust and optimize temperature uniformity during both steady-state and transient heating conditions. Thus, no known system provides flexible multi-zone control of wafer temperature and its uniformity during transient heat-up and cool-down as well as steady-state periods necessary for rapid thermal processing methods.

U.S. patent application Ser. No. 07/702,646, now U.S. Pat. No. 5,156,461 entitled "Multi-Point Pyrometry with Real-Time Surface Emissivity Compensation," by M. Moslehi and H. Najm describes a method and apparatus for multi-zone temperature sensing of semiconductor wafers during fabrication processing (hereinafter "M. Moslehi"). That invention describes a sensor and system that can accurately provide real-time semiconductor wafer temperature measurements at various points on the wafer. When the temperature sensor of that application is used in conjunction with the cross-lamp configuration of FIG. 2, there is some limited degree of temperature uniformity control possible during wafer heating conditions. However, because both the single arc lamp and the cross-lamp configuration do not have cylindrical symmetry, it is impossible to respond effectively to the precision multi-point temperature measurements that the invention of M. Moslehi provides.

U.S. patent application Ser. No. 07/690,426 describes a multi-zone illuminator for producing uniform temperature across a semiconductor wafer during fabrication. There, however, is no known system or method for integrating the beneficial results of the multi-point temperature sensor of U.S. patent application Ser. No. 07/702,646, now U.S. Pat. No. 5,156,461 with those of the multi-zone illuminator of U.S. patent application Ser. No. 07/690,426.

Thus, there is a need for system and method for real-time multi-point semiconductor wafer temperature and process uniformity control for improved real-time uniformity control for a wide range of single-wafer lamp-heated device processing applications.

There is a need for an automated and programmable system and method for semiconductor wafer temperature and process uniformity control during transient and steady-state heating conditions in a rapid thermal processing reactor.

There is a need for a system and method that programmably provides cylindrical symmetry in response to precise semiconductor wafer temperature measurements to control semiconductor wafer process uniformity.

Moreover, there is a need for a system that effectively combines a multi-zone illuminator heat source for use in device fabrication processes with a multi-point semiconductor wafer temperature sensor for real-time precision semiconductor wafer temperature and processing uniformity control.

SUMMARY OF THE INVENTION

The present invention accordingly provides a real-time multi-point semiconductor wafer temperature and process uniformity control system and method for use in association with a semiconductor wafer fabrication reactor during steady-state and transient wafer heating conditions that substantially eliminate and reduce disadvantages and limitations associated with known temperature and process uniformity control systems and methods.

According to one aspect of the invention, the system comprises in association a multi-zone illuminator, a multi-point temperature sensor, and process control circuitry. The multi-zone illuminator module selectively and controllably heats segments of the semiconductor wafer. The multi-point temperature sensor independently performs pyrometry-based temperature measurements of predetermined points of the semiconductor wafer. Process control circuitry operates in association with the multi-zone illuminator and the multi-point temperature sensor for receiving the temperature measurements and selectively controlling the illuminator module to maintain uniformity in the temperature measurements. A scatter module also provides input to process control circuitry for real-time emissivity compensation of the pyrometry-based temperature measurements of semiconductor wafer.

A technical advantage of the present invention is that it provides a system and method for automated and flexible wafer temperature control and real-time process uniformity optimization during steady-state as well as transient heat-up and cool-down thermal cycles for RTP-based device fabrication processes over a wide range of temperatures. For instance, for rapid thermal oxidation of semiconductor wafers, the present invention has the technical advantages of improving oxide thickness uniformity and eliminating or minimizing semiconductor wafer slip dislocations. It also provides capabilities for improved wafer-to-wafer process repeatability.

Yet another technical advantage of the present invention is that it provides full flexibility for real-time multi-zone process uniformity control at a low cost to the user. By automating many of the process control decisions, the present invention more precisely assures semiconductor wafer fabrication uniformity from wafer to wafer and point to point on each wafer.

BRIEF DESCRIPTION OF THE DRAWINGS

The invention and its modes of use and advantages are best understood by reference to the following description of illustrative embodiments when read in conjunction with the accompanying drawings, wherein:

FIG. 10 provides a side diagrammatic block diagram of a single-wafer rapid thermal processing reactor for fabricating semiconductor devices using the present invention;

FIG. 18 shows the electrical power supply components and power distribution system for the lamp sources of the three-zone configuration of FIG. 15;

FIG. 19 illustrates a semiconductor wafer surrounded by a light absorbing silicon or graphite ring that is used in conjunction with multi-zone lamp module of the present invention for increased temperature uniformity and control flexibility;

FIG. 20 provides a block diagram of a feedback control network that a preferred embodiment of the present invention uses in connection with a multi-point wafer temperature sensor to control and optimize the temperature uniformity of a semiconductor wafer during RTP device fabrication;

FIG. 21 provides an illustrative example of a computer look-up table that a preferred embodiment uses in association with the feedback control network of FIG. 20;

DETAILED DESCRIPTION OF THE INVENTION

The preferred embodiment of the present invention is best understood by referring to the figures wherein like numbers are used for like and corresponding parts of the various documents.

The continuing down scaling of device dimensions in VLSI/ULSI circuits places increasingly challenging demands on the manufacturing tools and technologies required to manufacture complex microelectronics chips. Rapid technological advancements have reduced the minimum feature sizes of the digital integrated circuits (IC's) well into the sub-micron regime. As a result, short-time and/or activated low-temperature processes are considered to be essential for minimizing the dopant redistribution problems, increasing the chip fabrication yield, and achieving enhanced process reducibility and control during the device fabrication sequence.

Figure 3:
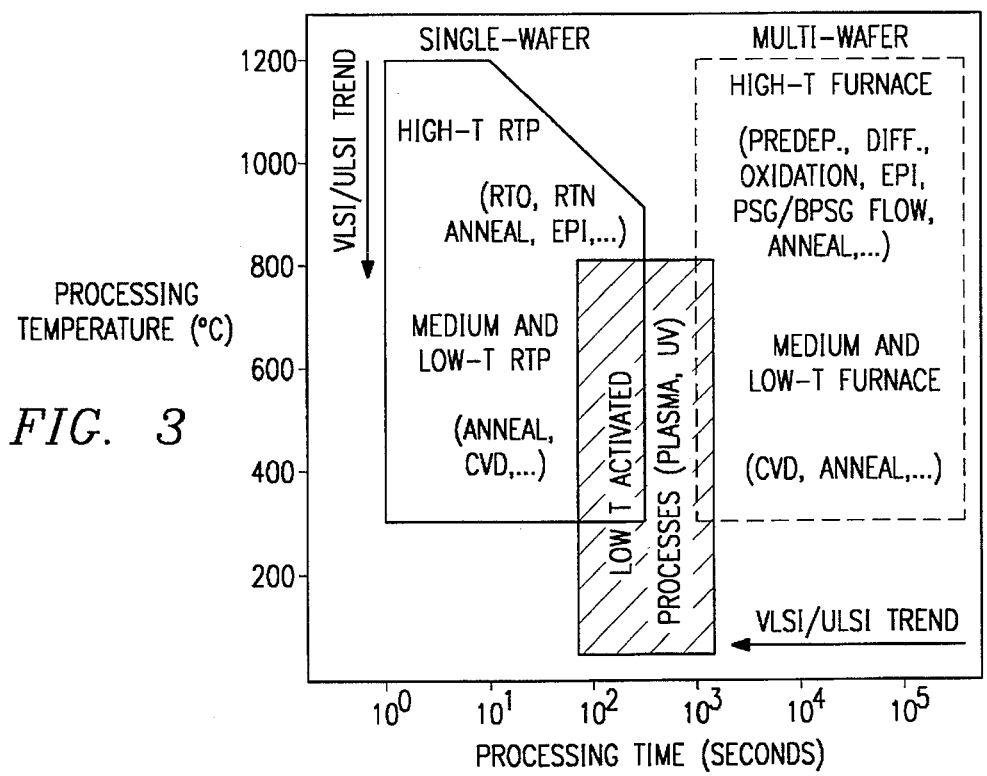
FIG. 3 provides a chart of a typical time-temperature parameter space for rapid thermal processing (RTP), low-temperature activated processing, and multi-wafer or batch furnace processing techniques for integrated circuit manufacturing.

Rapid thermal processing (RTP) offers an extended process parameter space which is different from that of the conventional batch furnace processing techniques. FIG. 3 illustrates the typical time-temperature parameter space for batch furnace processing, RTP, and low-temperature plasma or a photon activated processing techniques. In contrast to furnace processing, RTP is used primarily for short-time (e.g., 1–300 seconds) controlled wafer processing over an extended range of wafer temperatures. The low-temperature activated processing techniques such as photon- and plasma-assisted growth or deposition processes can drive the thermally activated device fabrication steps at lower processing temperatures due to the additional process enhancement effects caused by photo or plasma activation. The current generation of commercial lamp-heated RTP tools have been introduced mainly for high-temperature wafer annealing and thin dielectric growth applications. However, the single-wafer RTP reactors are now evolving towards advanced systems which can be used in applications such as epitaxial growth, chemical-vapor deposition (CVD) of tungsten, CVD of polysilicon and dielectrics, and in-situ multiprocessing.

RTP operates based on the single-wafer processing methodology which is considered desirable for flexible fast turn-around integrated circuit manufacturing. A large number of non-thermal processes (such as ion implantation, microlithography, plasma etching, etc.) in an integrated circuit fabrication sequence are now done in the single-wafer mode. However, most of the thermal fabrication steps (e.g., epitaxy, CVD, diffusion, oxidation, etc.) are still performed in conventional batch furnaces, mainly due to throughput requirements and manufacturing and process control problems associated with the commercial RTP techniques.

An example of RTP semiconductor wafer fabrication is described by M. M. Moslehi, in the article "Linearly Ramped Temperature Transient Rapid Thermal Oxidation of Silicon," *Appl. Phys. Letters* Vol. 53(12), Sept. 1988, pp. 1104–1106 ("Moslehi"). That article is a study of the silicon rapid oxidation processes that use transient cycles with controlled linear heat-up (and in some cases cool-down) segments. Moslehi shows the growth kinetics of a ramped-temperature transient rapid thermal oxidation process that uses RTP techniques. In that process, wafer temperature was raised at a rate of 50° C./s up to 750° C. where it was held for 5 seconds. A controlled linear heat-up ramp followed the preheating segment of the thermal cycle. The heat-up rate and the peak wafer temperature were varied in the ranges of 10° to 200° C./s and 950° to 1200° C., respectively.

Figure 4:
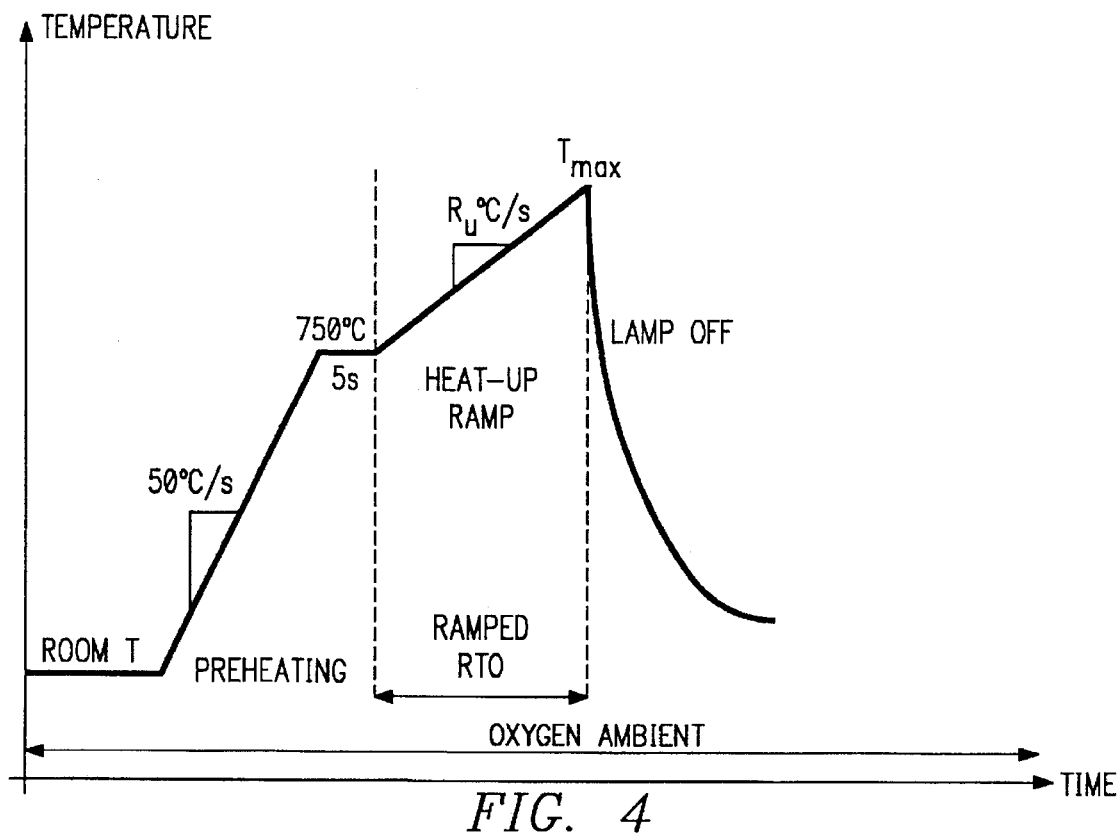
FIGS. 4 and 5 provide schematic illustrations of two representative ramped-temperature transient RTP thermal cycles.

FIG. 4 provides a schematic illustration of the temperature-vs.-time profiles associated with the process of the Moslehi example. The saw-toothed profile of FIG. 4 shows the employment of rapid cooling by turning off the lamp heat source when the temperature reached the desired $T_{max}$ (after a controlled heat-up segment).

Figure 5:
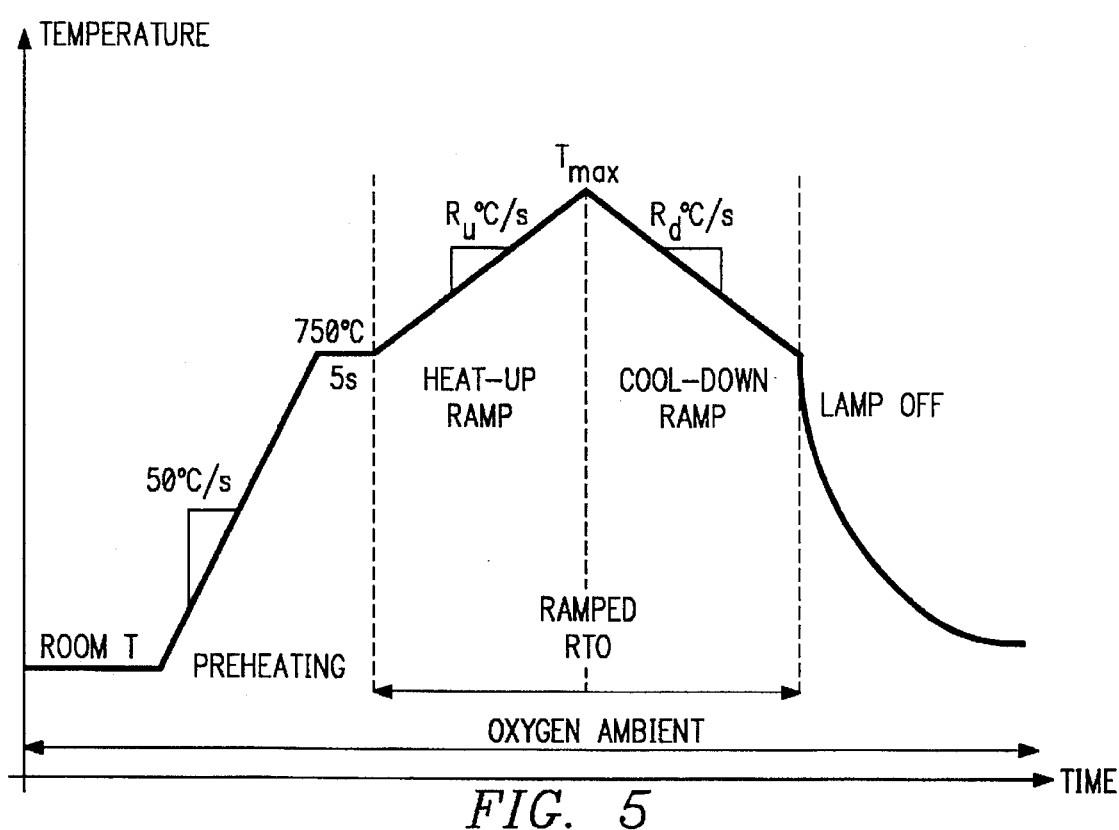

The heat-up part of the rapid thermal oxidation process, with triangular temperature profile is similar to that of the saw-toothed profiles. This is shown in FIG. 5. During the cool-down period of FIG. 5, however, a controlled linear ramp was used to reduce the temperature to 750° C. and then the lamp was turned off. The cool-down rate $R_d°$ C/s was chosen to be equal to the heat-up rate $R_u°$ C/s. The ranges of the ramp rates and peak temperatures were similar to those of the saw-toothed runs. This example is indicative of some transient RTP fabrication techniques using heat cycle engineering.

Figure 1:
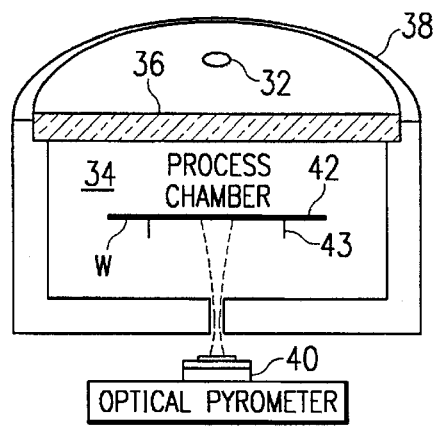
FIG. 1 provides a schematic diagram illustrating a known single arc lamp illuminator module on an RTP chamber for semiconductor wafer processing.
Figure 2:
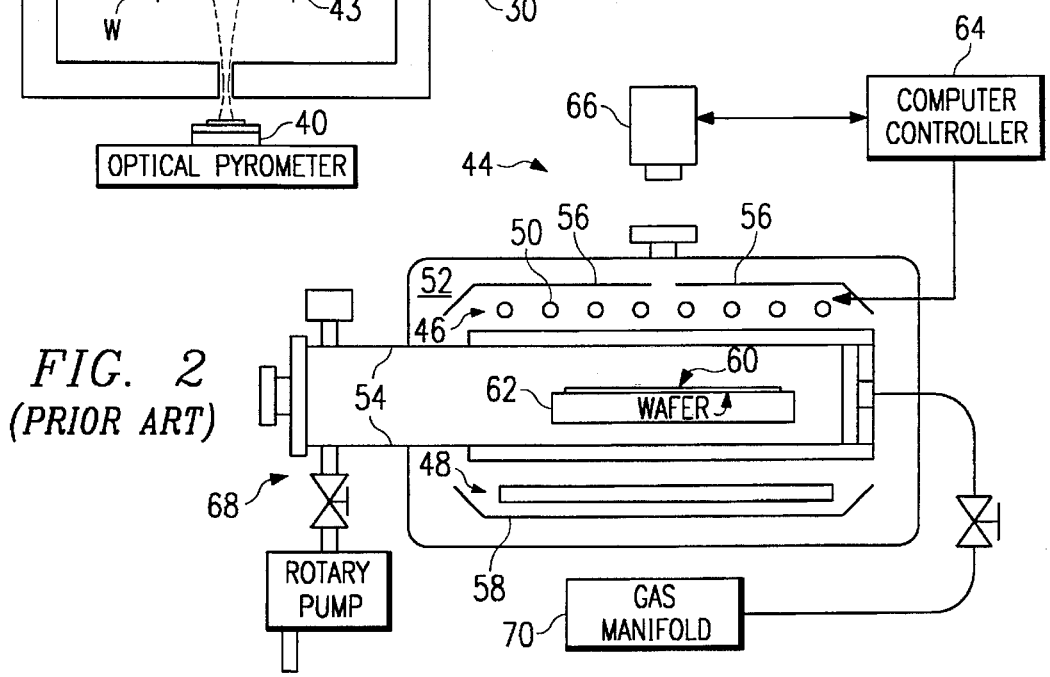
FIG. 2 provides a schematic diagram illustrating a known type of cross-lamp illuminator module for RTP-based semiconductor wafer processing.
Figure 6:
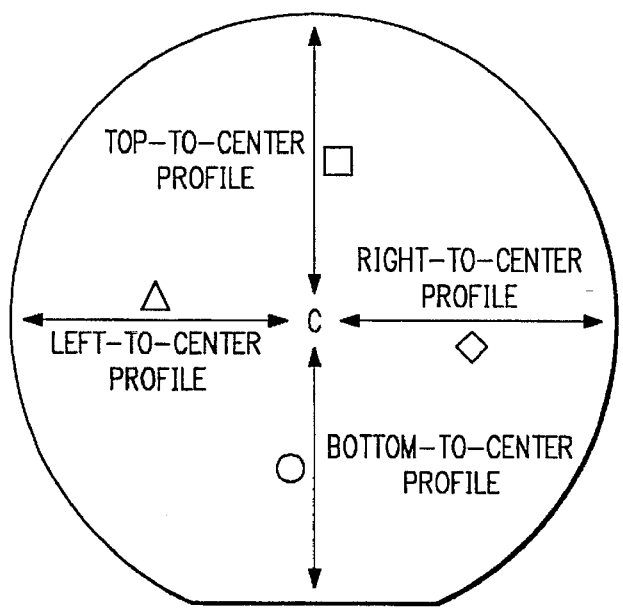
FIG. 6 provides a diagram of relative positions of four oxide thickness profiles measured on a semiconductor wafer.

Using known RTP lamp module (e.g., those of FIGS. 1 and 2), thermal stresses can cause nonuniform temperatures across the semiconductor wafer. Two important detrimental effects that can occur as a result of nonuniform semiconductor wafer temperatures are process nonuniformities and slip dislocation lines. FIG. 6 identifies positions and corresponding plot symbols of four oxide thickness profiles measured on semiconductor wafers that correspond to oxide thickness uniformity profiles appearing in FIGS. 7A and 7B. The thickness mapping measurements yielded the right-to-center (◊), top-to-center (□), left-to-center (∆), and bottom-to-center (o) profiles for the wafer. The measured thickness profiles are related to the cumulative effects of the temperature nonuniformities on the wafers during the transient rapid thermal oxidation process.

Figure 7A:
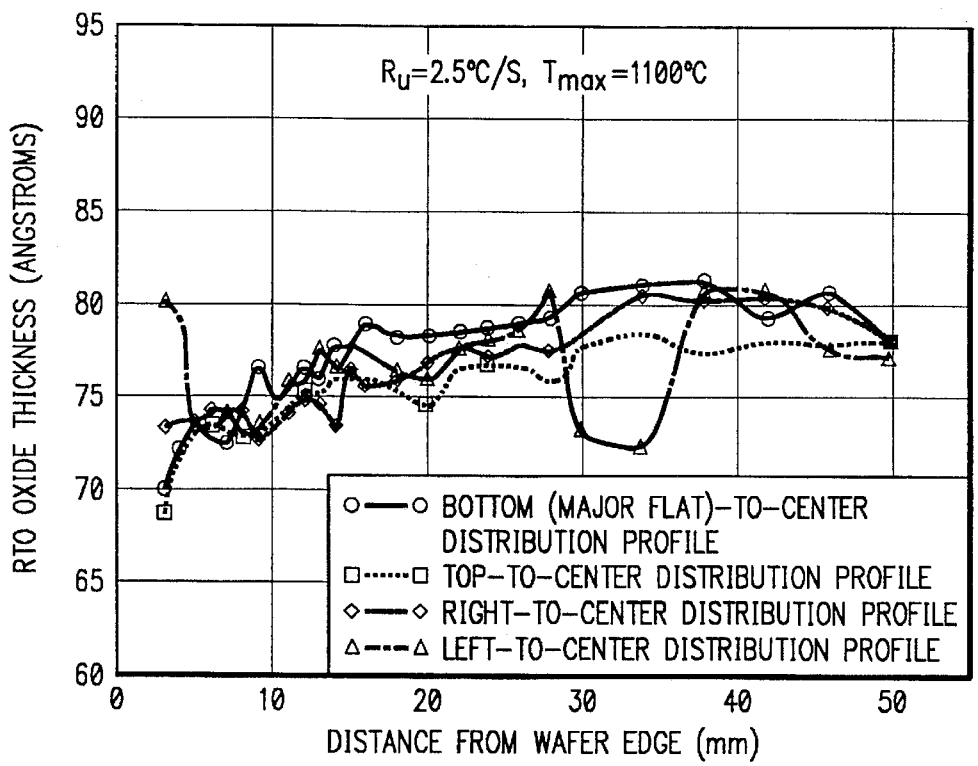
FIGS. 7A and 7B provide some oxide thickness uniformity profiles along the four radial profiles of FIG. 6 versus distance from the semiconductor wafer near edge.
Figure 7B:
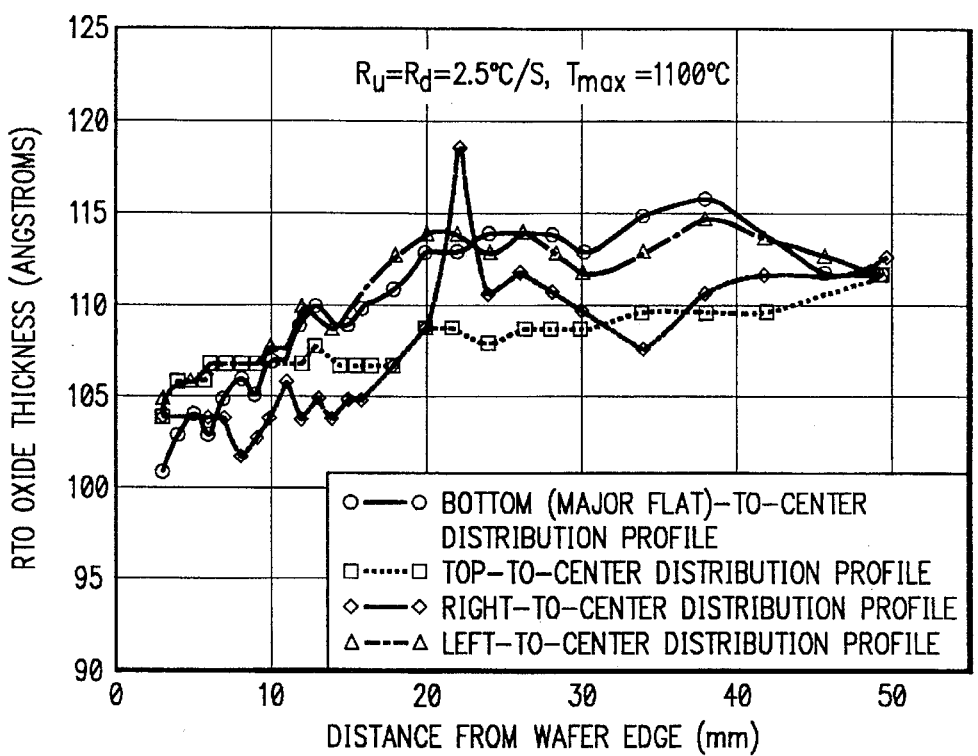

The oxide thickness maps of FIGS. 7A and 7B reflect the cumulative thermal effects of the wafer temperature distribution patterns during the transient heat-up and cool-down steps of rapid thermal oxidation. The oxide thickness is fairly uniform over most of the wafer area extending to about 10 millimeters from its edge, regardless of the ramp rate. However, the oxide thickness profiles indicate a significant nonuniformity within the outer 10 millimeter ring by as much as 15 to 20 angstroms. This large thickness reduction is a result of an excessive wafer edge cooling caused by edge heat losses. As observed in these profiles the process uniformity pattern is influenced by the type of the RTP thermal cycle.

Observation of slip dislocations after preferential etching verify that slips are generated more easily at higher temperatures and for faster temperature heat-up and cool-down transients (See Moslehi). For a given wafer temperature nonuniformity map, higher temperatures are more detrimental to the wafer, because the silicon yield stress decreases with temperature. Moreover, dynamics of wafer heating can have a strong influence on the maximum temperature nonuniformity. Faster heat-up and cool-down cycles can result in larger spatial transient temperature gradients compared with controlled slow temperature ramps and, as a result, are more likely to generate slips. Rapid thermal processing can be potentially a slip-free processing technique in a wide range of temperature and time process domains if the transient and steady-state temperature gradients, particularly near the wafer edge, are eliminated or at least minimized. Of course, this can not be done easily with the conventional RTP illuminators.

Figure 8:
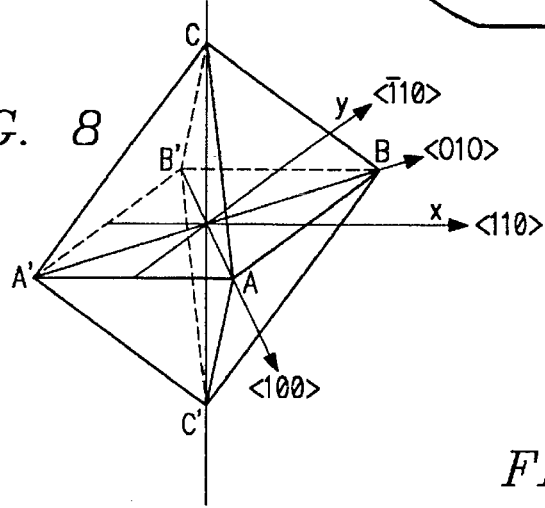
FIG. 8 shows the slip plane and slip dislocations in an elemental octahedron cell of a single-crystal silicon lattice.
Figure 9:
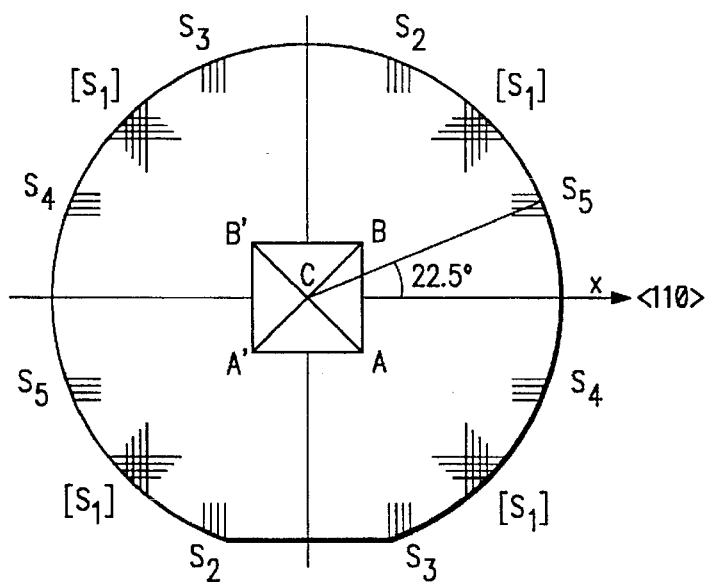
FIG. 9 shows the locations of maxima of the thermally-induced resolved stresses and the corresponding slip line directions on a silicon wafer and includes the projected image of the elemental octahedron cell.

FIGS. 8 and 9 shows RTP-induced slip dislocation lines and patterns generated due to excessive thermal stresses. X-ray topography can be used for both qualitative and quantitative evaluations of the process-induced slip dislocation lines. In silicon material with a diamond cubic crystal structure, the slip planes and the slip directions are {111} and [110], respectively. These slip planes and directions are demonstrated in the elemental octahedron illustrated in FIG. 8 (AB, BC, and CA are three of the slip directions).

FIG. 9 shows a schematic illustration of the primary and conjugate slip dislocation lines and the positions of the resolved stress maxima on a [100] wafer. $S_1$ through $S_5$ are the five independent stress components resolved on the {111} slip planes in the [110] slip directions. According to FIG. 9, the elemental octahedron shows four different orientations of {111} planes. The parameters $S_1$, $S_2$, and $S_3$ are the resolved stress components corresponding to the slip directions on the plane ABC which is a {111} plane. Accordingly to FIG. 9, the thermally-induced stress component $S_1$ may generate glide along the edges of the referenced pyramid of FIG. 9. This type of glide could only result in steps on the wafer edge without any visible effects upon the polished surface. The stress components $S_2$ and $S_3$ can generate displacements along the lateral edges of planes ABC, and A'B'C and as a result, slip bands corresponding to the x-axis direction. Moreover, the stress components $S_4$ and $S_5$ can produce slip bands associated with the y-axis direction.

Angular distribution of stress components has a 90° periodicity and is symmetrical with respect to the radial lines at 45° and 135°. Of course, this is true when there are no tangential temperature gradients on the wafers and the four quadrants have experienced cylindrically symmetrical temperature distribution profiles. The thermally-induced stress maxima occur at four edge regions located at $(2n+1)(\pi/8)$, n=0–7. These are the primary regions where the thermally-induced stresses can exceed the silicon yield stress and, therefore, are the most susceptible to formation slip dislocation lines. The stress maxima $S_1$ at the $(2n+1)(\pi/4)$ angular coordinates, n=0–3, are about twenty percent smaller than the other peak stress components ($S_2$–$S_5$). If the wafer temperature distribution map has cylindrical symmetry (the only non-zero gradients are the radial thermal gradients), all quadrants of wafer should exhibit similar slip dislocation line maps (90° periodicity). However, if the wafer thermal environment does not show cylindrical symmetry (non-zero radial and tangential gradients), some quadrants may show slip dislocation lines while other quadrants may be free of them, assuming uniform substrate material characteristics. In general, slip dislocations can cause problems such as fabrication yield reduction and microlithography pattern shift.

To explain how the present invention solves these technical problems, associated with known RTP methods, reference is made to the semiconductor wafer fabrication environment. FIG. 10 is a schematic representation of a semiconductor fabrication reactor 100 that establishes a representative environment of the present invention. Within a single-wafer rapid thermal processing reactor 100 such as the Texas Instruments' Automated Vacuum Processor (AVP), may reside semiconductor wafer 60. Beginning at the bottom right-hand corner of FIG. 10, gas distribution network 102 may comprise two gas manifolds: a non-plasma process gas manifold and a plasma manifold. Non-plasma gas manifold penetrates through reactor facing 108 via gas line 104 and process chamber wall 110 to proceed through ground electrode 112 and into gas injector 114. Plasma manifold connects into discharge cavity 118 via gas line 106 for generating process plasma. Process plasma activated species pass within plasma discharge tube 120 through reactor casing 108 and process chamber wall 110, through ground electrode 112 and into plasma injector 122 near gas injector assembly 114. Above gas injector assembly 114 and supported by low thermal mass pins 124 appears semiconductor wafer 60. Low thermal mass pins 124 are supported by ground electrode 112 (or a liner, not shown) within process chamber 126.

Process chamber 126 includes optical quartz window 128 which separates semiconductor wafer 60 from tungsten-halogen heating lamp module 130 of the present invention. In association with tungsten-halogen heating lamp module 130 may be multi-point sensor 132 (not shown) as described in U.S. patent application Ser. No. 07/702,646, now U.S. Pat. No. 5,156,461 by M. Moslehi, et al. filed on May 17, 1991 and assigned to Texas Instruments Incorporated. Vacuum pump connection 134 removes flowing process gas and plasma from process chamber 126 and into pumping package 136. Additionally, isolation gate 138 permits passage of semiconductor wafer 60 from vacuum load-lock chamber 140 into process chamber 126. To permit movement of semiconductor wafer 60 into process chamber 126, vertically moveable bellows or chamber lift mechanism 142 support process chamber collar 110.

Within vacuum load-lock chamber 140 appears cassette 144 of semiconductor wafers 60 from which wafer handling robot 146 removes a single semiconductor wafer 60 for processing. To maintain load-lock chamber 140 under vacuum, load-lock chamber 140 also includes vacuum pump connection 148.

Process control computer 150 controls the processing of semiconductor wafer 60 in RTP reactor 100. Control signals from process control computer 150 include signals to real-time controller 152. PID controller (or multi-zone real-time controllers) 152 provides various signals to multi-zone lamp module power supply 154. Lamp module power supply 154 responsively provides power settings to multi-zone tungsten-halogen heating lamp module 130.

Process control computer 150 also directs pressure setpoints to pumping package 136 as well as gas and plasma inlet flow signals to mass-flow controllers in the gas distribution network 102. To provide proper activation of plasma species at discharge cavity 118, process control computer 150 provides a control signal to microwave source 156 which, in the preferred embodiment, operates at a frequency of 2450 MHz.

Process control computer 150 checks the status of multi-zone lamp module 130 via line 158 for diagnosis/prognosis purposes and provides multiple temperature control signals to PID controller 152 in response to temperature readings of multi-point sensors (not shown). The multi-zone controller (or PID real-time controller) receives measured multi-point temperature sensor outputs (not shown) as well as the desired wafer temperature setpoint (from computer) and delivers controlled power setpoints to the lamp power supplies. Sensing lines 159 between process control computer 150 and multi-zone lamp module 130 of the present invention include signals from multi-point temperature sensor (not shown) for real-time semiconductor wafer 60 temperature measurements.

Figure 11:
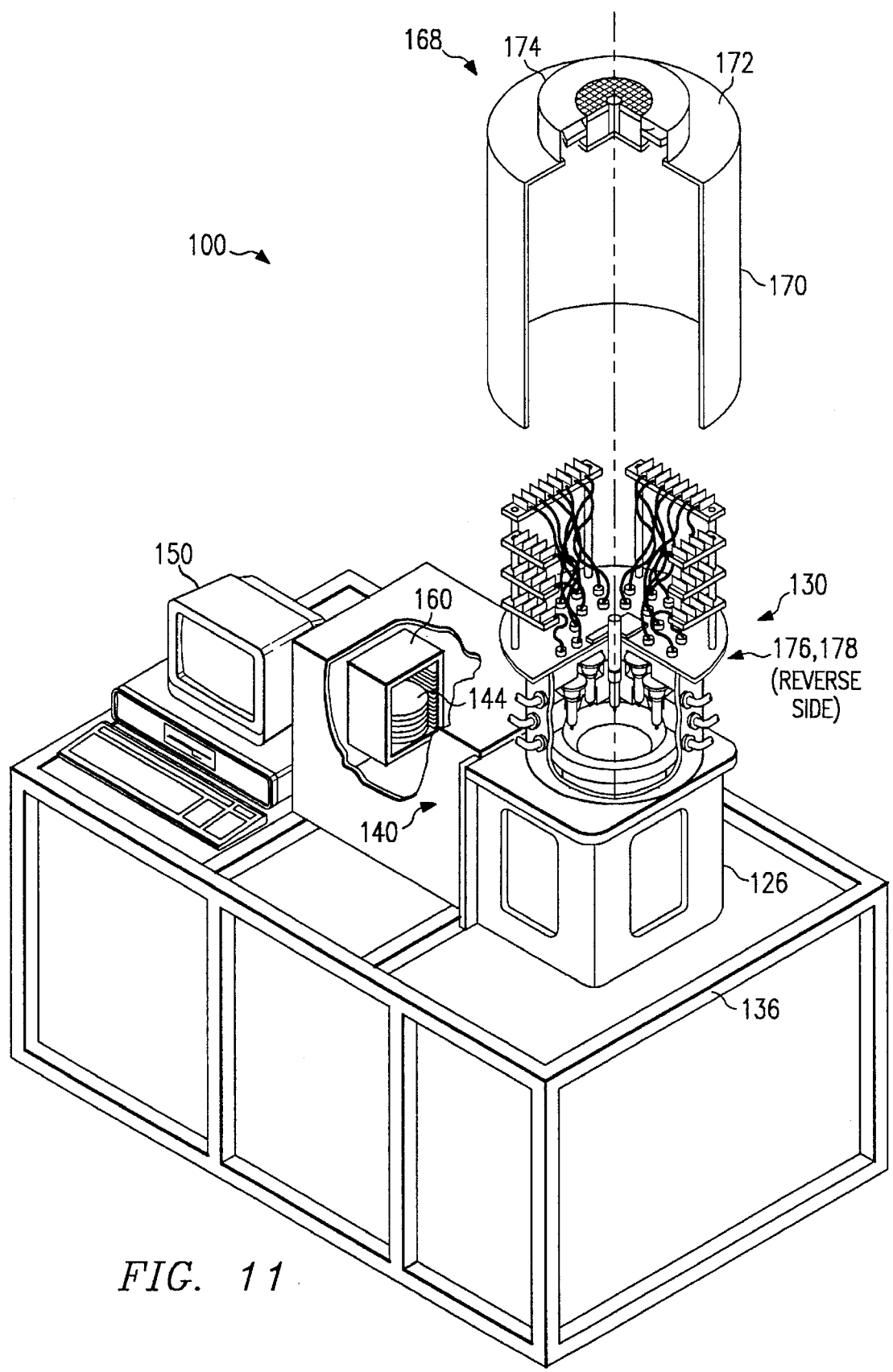
FIG. 11 provides a partially cut-away schematic view of a preferred embodiment of the present invention in association with the processing chamber of the FIG. 10 reactor.

FIG. 11 shows a perspective view of the Texas Instruments AVP operating as an RTP reactor 100 for purposes of the present invention. Process chamber 126 is mounted on reactor frame 136. Process chamber 126 rigidly supports multi-zone lamp module 130. Adjacent to process chamber 126 is vacuum load-lock chamber 140 within which appears cassette 160 for holding semiconductor wafers 144. Adjacent to vacuum load-lock chamber 140 is process control computer 150 which controls the operation of the various elements associated processing reactor 100.

Figure 12:
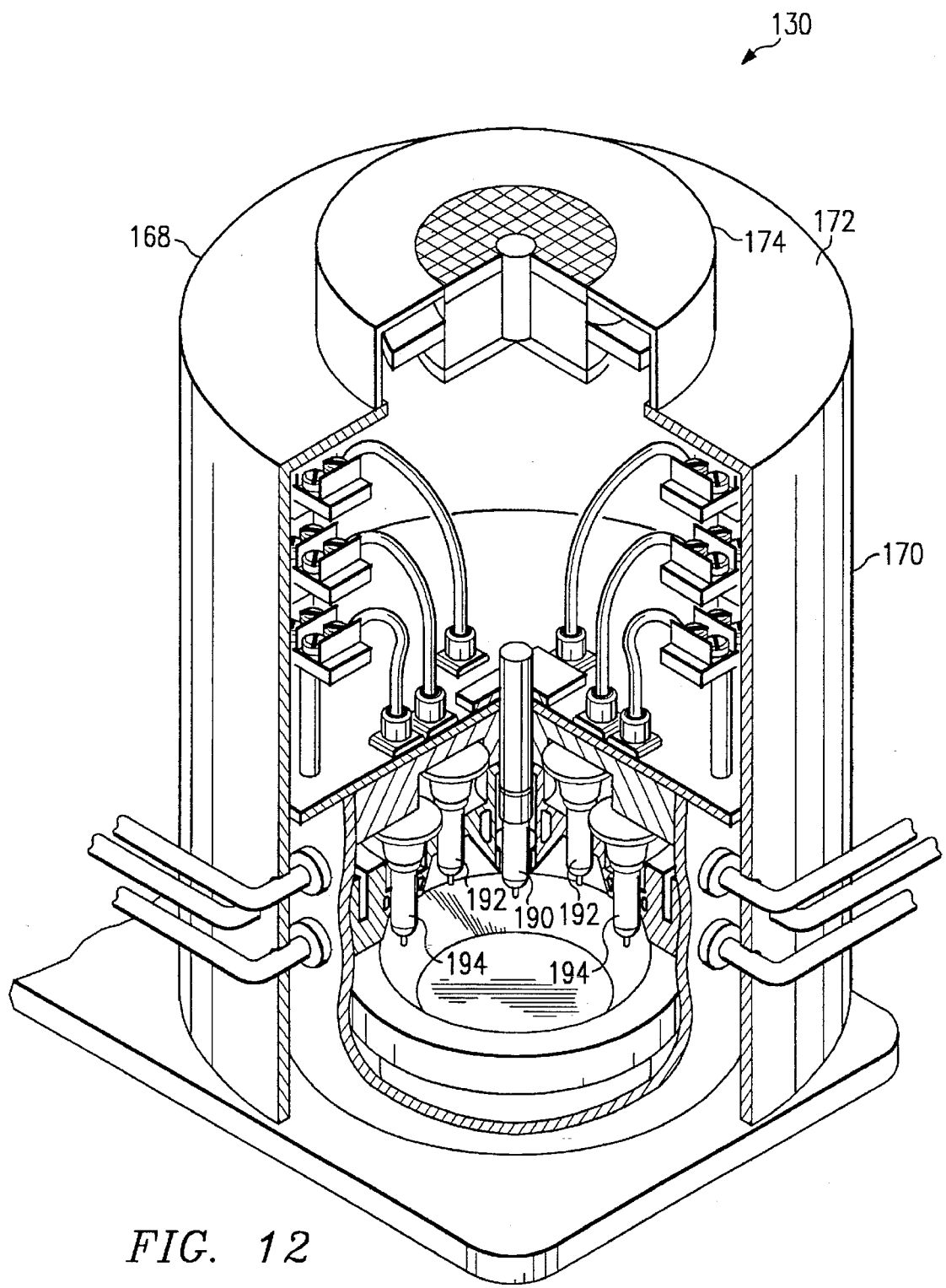
FIG. 12 shows a partially cut-away side schematic view of a 3-zone configuration of a preferred embodiment of the present invention.
Figure 13:
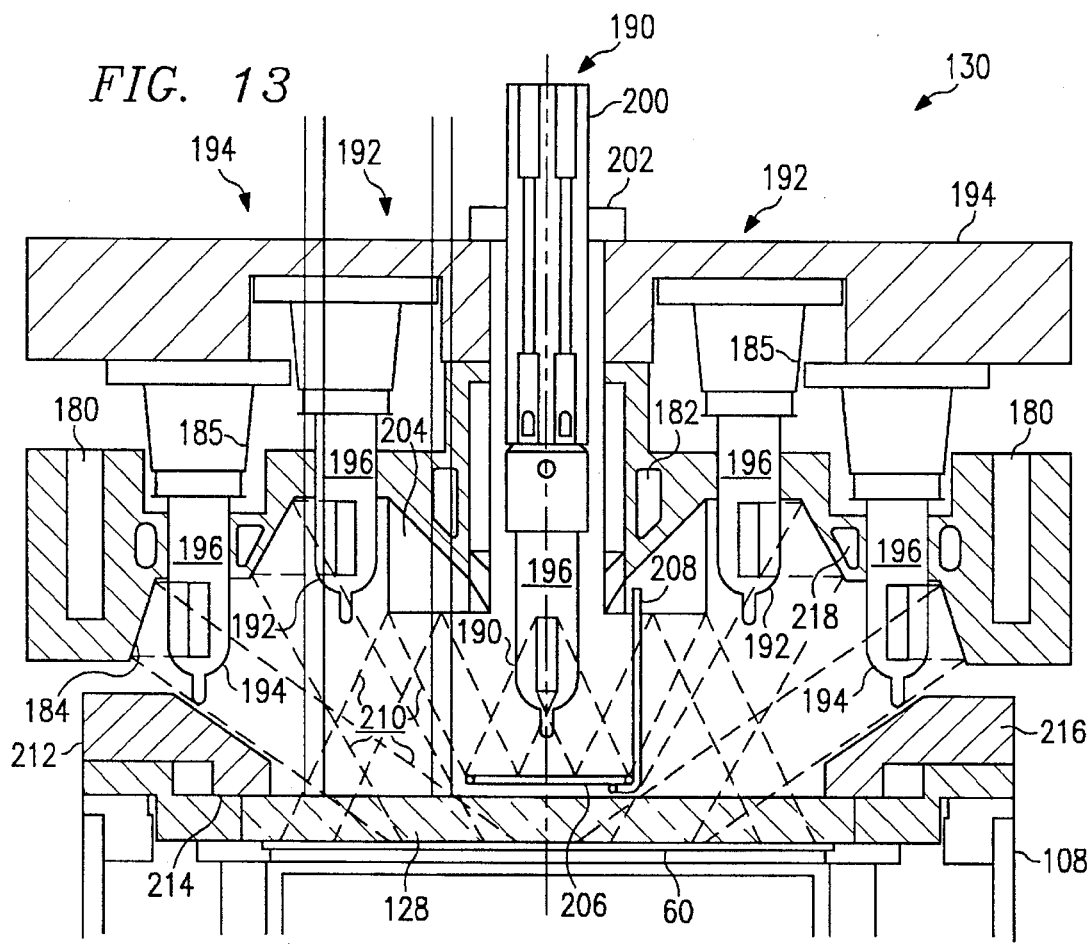
FIG. 13 provides a side-schematic view of a three-zone configuration of a preferred embodiment of the present invention.

FIG. 12 illustrates a partially cut-away perspective view of a three-zone version of the multi-zone lamp module 130 of the present invention. Moreover, FIG. 13 shows a schematic side view of the three-zone lamp module of FIG. 12. Mounted rigidly to reactor casing 108 above optical quartz window 128 appears multi-zone lamp module 130. Surrounding multi-zone lamp module is casing 168 having cylindrical vertical wall 170 and circular flat top portion 172. Resting on circular top portion 172 is lamp cooling fan 174. Cooling fan 174 may also be mounted on the sidewall 170 of the casing 168 in order to leave the top portion 172 available for implementation of multi-point sensors and associated fiber-optic light pipes. Power to multi-zone lamp module 130 is provided by electrical cables 176 and 178. Channels 180 and 182 provide coolant flow to reflector 184. Within casing 168 appears internal portions of lamp module 130 which include lamp socket base 185 and reflector 184.

The embodiment of the present invention that FIGS. 12 and 13 show is a three-zone configuration comprising center lamp zone 190, middle or intermediate zone 192 and outer zone 194. Intermediate zone 192 and outer zone 194, in the preferred three-ring embodiment, comprise 12 lamps and 24 lamps, respectively. Each of lamps 196 passes through water-cooled reflector 184 so that the lamp quartz jacket and tungsten filament are below the water-cooled reflector 184. Lamp 196 of center lamp zone 190 has a variable vertical position in the preferred embodiment that may be adjusted by appropriate movement of socket stem 200 within mounting base 202. Similar vertical adjustment capabilities may also be included for the other lamp zones. Center zone 190 may also comprise optional add-on reflector 204 that includes first reflecting plate 206 and secondary reflector 208. However, the preferred embodiment of this invention does not require the add-on central reflector module 204.

Additionally, associated with the operation of multi-zone lamp module 130 is multi-point wafer temperature sensor which includes optical fiber light pipes (not shown) that fit within hollow pipes in the lamp module 130. Sensor light pipes may associate with semiconductor wafer via multi-zone lamp module 130 to provide real-time multi-zone control of semiconductor wafer 60 temperature and its uniformity as described below in association with FIGS. 20 through 23.

As ray traces 210 indicate, reflector 184 is designed to properly reflect and direct light from lamps 196 of center zone 190, middle zone 192 and outer zone 194 toward semiconductor wafer surface. Lamps 196 of middle zone 192 and outer zone 194 all fit within rigidly mounted sockets 185.

Figure 14:
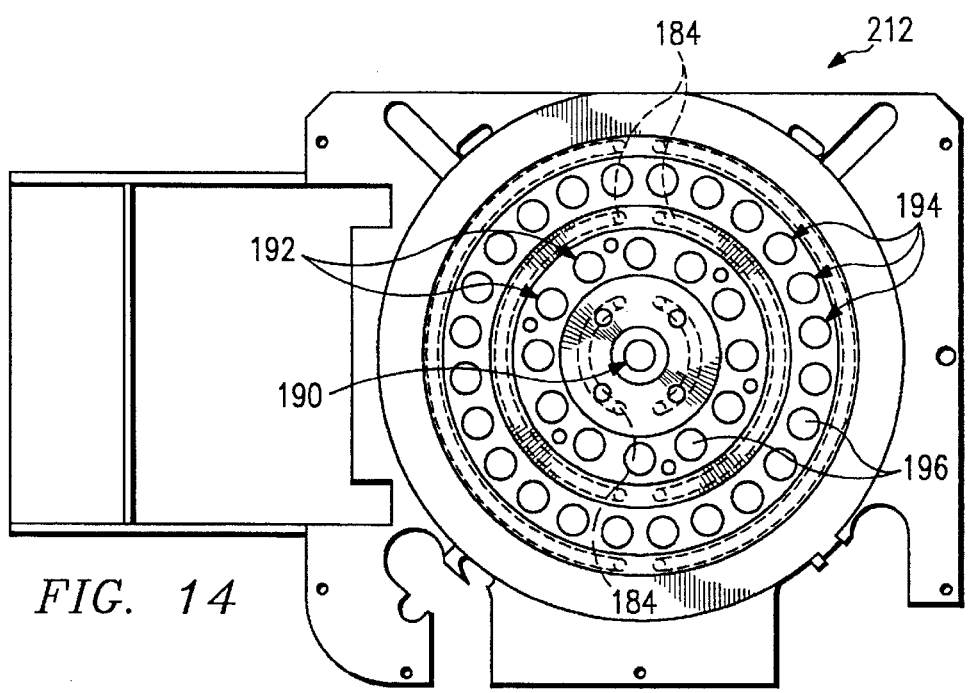
FIG. 14 provides a bottom view of the configuration of FIG. 13 showing the reflector and point source lamp configuration as well as the sensor light pipes of a preferred embodiment of the present invention.

FIG. 14 provides a bottom view of the configuration of FIG. 13, and particularly, reflector 184 and associated light zones 190, 192, and 194. Multi-zone lamp module 130 mounts to process chamber vacuum lid 212 and directs light towards the wafer through optical quartz window 128. Optical/vacuum quartz window 128 rests within recess 214 of process chamber vacuum lid 212 and is held secure by mounts 216. The diameter of the lamp module reflector 184 is at least 1" to 2" greater than that portion of optical quartz window 128 through which optical energy from lamps 196 passes. This is due to the fact that a larger diameter lamp heating source is capable of providing a larger optical view factor for wafer edge, resulting in more uniform wafer heating.

In the preferred embodiment, reflector 184 comprises an aluminum or stainless steel material that is polished and coated with gold, chromium, or some other highly reflective material. The preferred embodiment of this three-zone lamp comprises 24 individual 1 kW tungsten-halogen lamps 196 in the outer zone 194. The middle zone lamps 192 comprise twelve 1 kW lamps and the center heating zone 190 comprises a single 1 kW lamp.

The three-zone lamp of FIGS. 12 and 13 has been designed for up to 6" wafer processing. However, the multi-zone lamp design can be easily scaled for processing of larger wafers (8" or larger). The illuminator scaling can include enlarging the reflector dimensions as well as increasing the individual lamp power ratings. Typically the number of lamps in each zone will vary. This is the case in the preferred embodiment. Each lamp zone is controlled independently and connected to an independent dedicated electrical power supply. The power supply for each lamp zone is associated to control all lamps within a single zone simultaneously. If necessary, the lamps within each zone (center, middle, or outer zone) may be further partitioned into several sub-zones to provide additional zone control capabilities. It may be desirable, for instance, to divide the middle or outer zone into four quadrants, for example, but this high level of multi-zone control is not necessary as long as the lamps in each zone are matched in terms of filament resistance and output optical flux intensity. The three-zone lamp module provides excellent flexibility and a simple implementation for multi-zone control to achieve semiconductor wafer temperature uniformity during both steady-state and transient RTP conditions. Center zone 190 was chosen as a single lamp, because the single lamp provides sufficient illumination for purposes of the present invention using a 1 kilowatt bulb. If desired, the power of the center lamp may be increased to 2 kW or even higher.

An essential aspect of the present invention is its forming concentric rings of optical sources using individual point source lamps. Because of the multiple lamp sources in each zone (except for the single lamp in the central zone) and their proximity to one another, each zone provides a continuous photon radiation ring at the semiconductor wafer surface. The center does not provide a ring configuration, but does provide a circular illuminating source. Using the multiple independent point source lamps connected all to one power supply, however, is significantly more economical and practical than providing a single ring-shaped lamp, and is also considerably less complicated. The present invention, therefore, avoids this complication by using multiple lamps arranged in concentric rings. Each single lamp (known as a point source) can use as much as 1 kilowatt of electrical power, in the preferred embodiment. Other choices of lamp ratings such as 500 watts, 750 watts, 2 kilowatts, or even more may also be used. The lamps used in the preferred embodiment of this invention require electrical connectors on one side only (socket side).

Within reflector 184 appear reflector coolant channels 182, 218, 180 for center lamp zone 190, 220 middle lamp zone 192, and 222 for outer lamp zone 194. Through these channels flows cooling water to remove heat from lamps 196 that reflector 184 absorbs.

Figure 15:
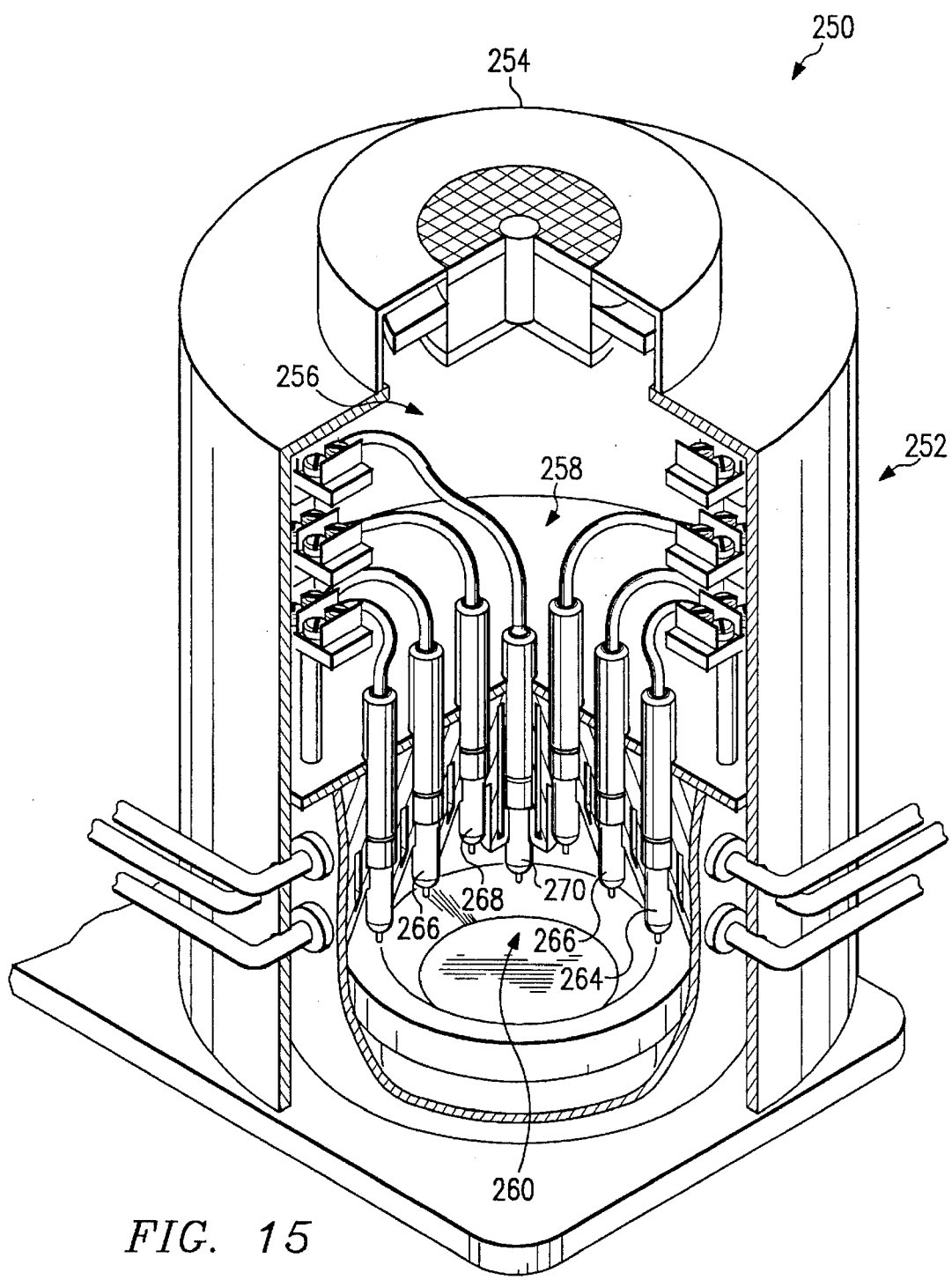
FIG. 15 shows a partially cut-away side schematic view of a 4-zone configuration of a preferred embodiment of the present invention.
Figure 16:
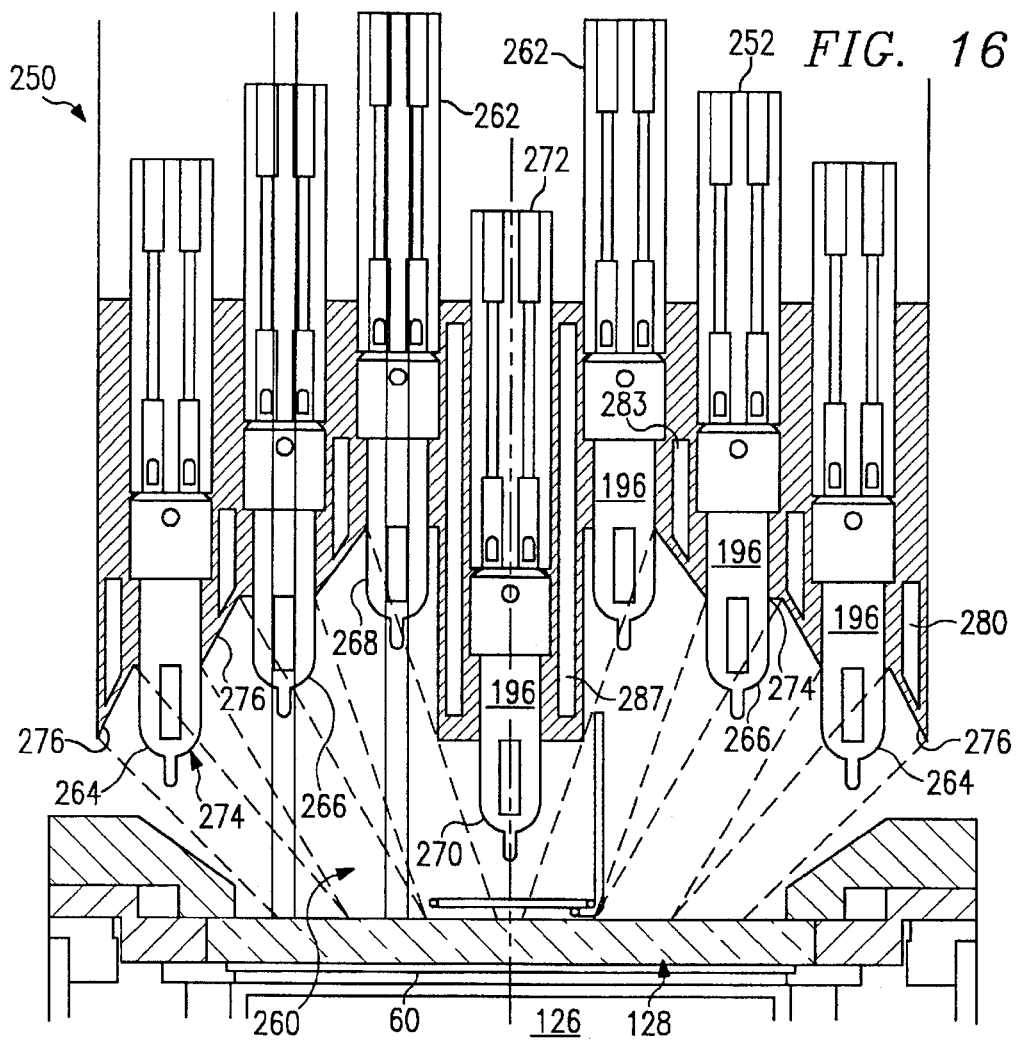
FIG. 16 provides a side schematic view of a four-zone configuration of a preferred embodiment of the present invention.

FIGS. 15 and 16 provide side schematic views of a four-zone configuration 250 which is another preferred embodiment of the present invention. Casing 252 surrounds four-zone lamp module 250 and includes on its top lamp cooling fan 254. Within casing 252 appears four-zone lamp housing. Four-zone lamp housing includes mounting brackets for separating upper module portion 258 from lower module portion 260. Upper module portion 258 comprises sockets 252 for holding each individual lamp 196 in place. In the preferred embodiment the four zones include outer zone 264, outer middle zone 266, inner middle zone 268 and center zone 270. Center zone 270 comprises a single 1 kilowatt tungsten-halogen lamp which, as in the three-zone case, has a variable vertical position controllable by variable socket positioner 272. Other lamp zones may also employ variable socket positioners as well.

In the preferred embodiment, inner middle zone 268 comprises seven 1-kilowatt tungsten-halogen lamps rigidly mounted in sockets 262. Outer middle zone 266 comprises 14 tungsten-halogen lamps 196 and outer zone 262 comprises 28 one kilowatt lamps 196. Inner middle zone 268, outer middle zone 266, and outer zone 264 lamps are all rigidly mounted in upper module portion 258. Lamps 196 from each of the zones fit through openings 274 of reflector 276.

Reflector 276 is integral to lower module portion 260 and includes reflective surfaces and coolant channels 280, 281, 283, 287. Light from lamps 196 of each of the four zones from four-zone lamp 250 is reflected and directed by the reflective surface (polished surface coated with a suitable mirror material such as gold or chromium) of reflector 276 to and through optical quartz window 128 towards semiconductor wafer 60 (FIG. 16) within process chamber 126.

Figure 17:
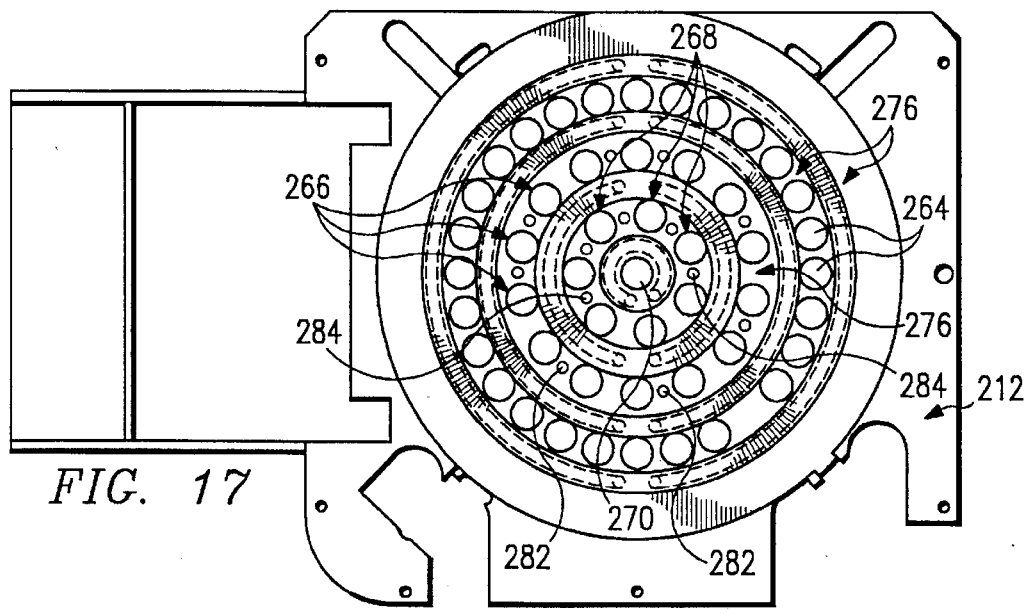
FIG. 17 provides a bottom view of the configuration of FIG. 16 showing the reflector and point source configuration as well as the sensor light pipes of a preferred embodiment of the present invention.

FIG. 17 provides a bottom view of the configuration of FIGS. 15 and 16, showing reflector 276 which is placed over optical quartz window 128 and mounted to process chamber vacuum lid 212. Four-zone lamp module 250 includes outer lamp zone 264 comprising 28 one kilowatt lamps, outer middle lamp zone 266 comprising 14 one kilowatt lamps 196, and inner middle zone 268 of 7 one kilowatt lamps all surrounding center zone 270. Lamp zones 264, 266, 268 and 270 are concentric and positioned such that center zone 270 is closer to semiconductor wafer to meet optical flux requirements on semiconductor wafer 60 within process chamber 126. In addition to providing for the passage of individual lamps 196 through reflector 276, reflector 276 comprises a plurality of spaced hollow light pipes 282 within outer middle lamp zone 266 and spaced light pipes 284 within inner middle lamp zone 268. Light pipes 282 and 284 are positioned to permit implementation of fiber-optic multi-point temperature sensors as described in U.S. patent application Ser. No. 07/702,646, now U.S. Pat. No. 5,156,461 by M. Moslehi, et al. and assigned to Texas Instruments Incorporated.

While three-zone lamp module 130 was designed for low to medium temperature applications such as low-pressure CVD and silicide formation, and for operating in temperatures between 300° C. and 950° C., the four-zone lamp module 250 provides a high degree of dynamic control flexibility and offers extended temperature range of operation between 300° C. and 1200° C. Additionally, three-zone lamp 130 is designed for up to 6"–8" semiconductor wafers, but four-zone lamp is capable of processing of 8" to 10" wafers. Moreover, the four-zone lamp may be easily scaled for processing larger semiconductor wafers. Four-zone lamp module 250 generally provides improved flexibility for real-time dynamic wafer temperature uniformity optimization and control. This type of control is possible with the three-zone lamp module 130, but the operational flexibility of a three-zone module 130 is somewhat less than four-zone lamp module 250.

Applications for which four-zone lamp module 250 is particularly suitable include (but are not limited to) numerous high temperature applications such as rapid thermal oxidation, rapid thermal nitridation, rapid thermal annealing, and single-wafer epitaxy. Additionally, lower temperature applications such as LPCVD polysilicon/amorphous silicon can also employ the four-zone lamp module 250 with, again, increased flexibility for real-time temperature uniformity control. Four-zone lamp module 250 uses four individual remote controlled power supplies. One power supply is used to control each of the four concentric zones 264, 266, 268 and 270. Like the three-zone lamp module 130, four-zone lamp module 250 uses a single tungsten-halogen lamp 196 for center lamp zone 270.

FIG. 18 shows the electrical connection of the lamp point sources of the configuration of FIG. 12 (three-zone system). The electrical connections for four-zone lamp module 250 are essentially similar to those for three-zone lamp module 130 (however, there are larger number of lamps in the four-zone module). The three-zone lamp module uses three independent power supplies. Power Supply 1 286 supplies up to 1 kW of power to the central zone and Power Supply 2 288 delivers up to 12 kilowatts of power to the middle zone. The third power supply (Power Supply 3 290) provides up to 24 kW of electrical power to the outer zone 194. Both Power Supply 2 288 and Power Supply 3 290 provide three-phase power from 208 V three-phase supply line in response to respective setpoints $P_2$ and $P_3$. Power Supply 1 286 is a one-kilowatt 120 volt single-phase AC power supply that in response to setpoint $P_1$ provides adjustable power to lamp 196 of center lamp zone 190. Power Supply 3 290 supplies eight lamps (110 V tungsten-halogen lamps) between each pair of phases. The eight lamps across each pair of phases are configured as four parallel lines of series lamp pairs. Lamp groups 292, 294, and 296 are supplied by Φ1Φ2, Φ2Φ3, and Φ1Φ3 phase pairs, respectively. This configuration ensures balanced operation of the three-phase power supply. However, other wiring configurations may also be employed (depending on the maximum voltage ratings of the lamps and power supplies).

Power Supply 2 288 also provides up to 208 volts, three-phase, AC power, but only serves two branches of 2-lamp series pairs between each pair of phases, (Φ1Φ2, Φ2Φ3, and Φ1Φ3). Two sets of 2-lamp series pairs across each pair of phases for a total of 12 one-kilowatt lamps are supplied by 12 kilowatt zone Power Supply 2 288. Finally, for the three-zone lamp module 130, center lamp zone 190 receives only up to 120 volts of one-kilowatt single-phase AC power.

Although the respective maximum powers for Power Supply 3 290, Power Supply 2 288 and Power Supply 1 286 are 24 kilowatts, 12 kilowatts, and one kilowatt, these power ratings are dependent on the lamps used within each of the associated optical zones. If, for example, each individual lamp consumes up to two kilowatts of power instead of one kilowatt of power, the respective zone power supply must be doubled in output. Moreover, the three- phase power circuit for four-zone embodiment 250 has a fairly similar configuration, but with four independent power supplies (one for each lamp zone). To balance loads across each pair of phases of each power supply, the 4-Lamp zone embodiment uses dummy power loads (such as dummy lamps).

FIG. 19 shows a SiC-coated graphite ring 306 surrounding semiconductor wafer 60. This configuration is used within RTP process chamber 126. Additionally, temperature sensing points T1, T2, T3, and T4 correspond to points for sensing the radial temperature profile of semiconductor wafer 60 from its center out to the wafer edge in real time. Because lamp module 130 of the present invention provides cylindrical symmetry, a measurement of the radial wafer temperature profile will provide a reliable indication of the overall wafer temperature uniformity.

Graphite ring 306 has an inner diameter that is slightly larger than the outer diameter of the semiconductor wafer 60. It does not, however, make contact with semiconductor wafer 60. Graphite ring 306 acts as a radiation shield to reduce the amount of thermal energy or blackbody radiation lost from semiconductor wafer 60 at its edge. Graphite ring 306 contains a silicon carbide coating (with additional optional coating of silicon) for oxidation resistance and preventing process contamination from graphite. It is possible to make the heat shield ring using another clean photon-absorbing material such as polycrystalline or single-crystal silicon. In a general sense, heat shield ring 306 is a photon-absorbing material that, as long as it absorbs photon, optical energy will be reradiated back to the edge of semiconductor wafer 60 to eliminate the edge loss effects. The ring may also be made of an infrared reflective material with little direct light absorption such as quartz. The combination of graphite ring 306 and lamp module 130 provide extended flexibility for temperature and process uniformity control across the semiconductor wafer 60. Graphite ring 306 may be a fraction of a millimeter in thickness or it may be as thick as 3–5 millimeters. The graphite ring 306 outer diameter is not critical and may be approximately ½ to 1 inch greater than the inner diameter. Graphite ring 306 also conforms to the shape of semiconductor wafer 60. In particular, where semiconductor wafer 60 has a major flat edge 308, graphite ring 306 includes flat edge 310 to maintain a constant distance from the edge of semiconductor wafer 60. The heat shield ring may be mounted in the same plane as the wafer, above the wafer, or below the wafer in the process chamber.

TABLE 1

| P1 = 54 P2 = 0.950 P3 = 1.225 | Power zone setting (no physical units) | | | |
|---|---|---|---|---|
| TIME (sec) | T1 | T2 | T3 | T4 |
| 60 | 491 | 500 | 496 | 504 |
| 90 | 565 | 564 | 567 | 565 |
| 180 | 591 | 589 | 591 | 590 |
| 240 | 608 | 606 | 2608 | 607 |
| 300 | 628 | 627 | 629 | 628 |

Table 1 shows 37 kilowatt lamp temperature uniformity results using the combination of semiconductor wafer 60, multiple bonded thermocouple sensing points T1, T2, T3, and T4 and graphite ring 360. Semiconductor wafer 60 is a 150-mm diameter wafer containing bonded thermocouple points T1, T2, T3, and T4 distributed between the center and edge of semiconductor wafer 60. All tests shown in the this table were run using 900 sccm of hydrogen within process chamber 126 at various pressures. In Table 1, the adjustable lamp in the center lamp zone 196 was placed in its lowest vertical position just above the optical/vacuum quartz window and graphite ring 306 was placed in the same plane as semiconductor wafer 60 within process chamber 126. Power settings for the lamp zone power supplies are shown in Table 1. (Optimized settings shown in arbitrary units). Thermocouple readings were taken at 60, 90, 180, 240, and 300 seconds after turning on all three power zones on lamp module 130. Pressure within process chamber 126 was 0.5 Torr for a wafer temperature ranging from 500° to 628° C. Table 1 shows that at 300 seconds following activating lamp module 130, the temperature across semiconductor wafer 130 ranges from 627° C. to 629° C. This provides a maximum radial temperature deviation of less than ±1° C. across the semiconductor wafer assuming a cylindrically symmetrical wafer temperature distribution. The lamp zone power settings were optimized for the best uniformity after 300-sec into wafer heating.

TABLE 2

| P1 = 54 P2 = 0.935 P3 = 1.250 | Power zone settings (arbitrary units) | | | |
|---|---|---|---|---|
| TIME (sec) | T1 | T2 | T3 | T4 |
| 60 | 527 | 535 | 539 | 541 |
| 90 | 580 | 579 | 586 | 583 |
| 180 | 605 | 605 | 609 | 609 |
| 240 | 622 | 621 | 625 | 624 |
| 300 | 636 | 635 | 638 | 637 |

Table 2 provides similar data for the situation where center lamp zone 198 is again placed at its lowest position above optical quartz window 128. Pressure within process chamber 126, again, is 0.5 Torr and power supplies 1, 2 and 3 have power settings as shown. Power settings shown for power supplies 1, 2 and 3 are in arbitrary units and do not indicate kilowatts or other power units. They are simply the remote setting signal levels. They are, however, reproducible settings for center zone lamps 196, middle zone lamps 192, and outer zone lamps 194. Readings from Table 2 indicate radial temperature profiles 60–300 seconds after energizing lamp module 130. These data also show similar lack of variation among the thermocouple points T1, T2, T3 and T4 with 3° C. maximum temperature variation. The radial wafer temperature distribution between T1 and T4 is 636°, 635°, 638° and 637° C. (after 300 sec.). The lamp power settings had been optimized (approximately) for uniform wafer heating, 300-sec after turning the lamps on.

TABLE 3

| P1 = 70 P2 = 0.605 P3 = 1.650 | Power zone settings (arbitrary units) | | | |
|---|---|---|---|---|
| TIME (sec) | T1 | T2 | T3 | T4 |
| 60 | 590 | 591 | 597 | 600 |
| 90 | 661 | 658 | 664 | 668 |
| 180 | 679 | 675 | 680 | 683 |
| 240 | 691 | 686 | 691 | 695 |
| 300 | 703 | 697 | 702 | 705 |

As another example, Table 3 shows experimental conditions similar to that of Tables 1 and 2, except that in this instance, graphite ring 306 was placed at a plane which was 0.2 inches away from the plane of semiconductor wafer 60. Power settings to the lamp zone power supplies are as shown. Table 3 shows that at the point of temperature stabilization, i.e., at 300 seconds following the initiation of optical energy from lamp module 130, a greater temperature variation exists as a result of the different position of graphite ring 306 with respect to semiconductor wafer 60. Thus, while the circular zones of light module 130 provide significant improvements in temperature uniformity across the surface of semiconductor wafer 60, the addition of graphite ring 306 further enhances capabilities to provide wafer temperature uniformity.

A particularly advantageous feature of the present invention is its ability to be used with a multi-point temperature sensor described in U.S. patent application Ser. No. 07/702, 646, now U.S. Pat. No. 5,156,461 by Moslehi, et al. and entitled "Multi-Point Pyrometry With Real-Time Surface Emissivity Compensation" filed on May 17, 1991 (hereinafter the "Pyrometry Application"). Using the invention of the Pyrometry Application with the multi-zone lamp layout of the present invention and process control computer 150, it is possible to provide real-time wafer temperature uniformity during steady-state and transient semiconductor wafer heating.

FIG. 20 shows a block diagram for achieving real-time semiconductor wafer temperature and process uniformity control using the combination of the multi-point temperature sensor of the Pyrometry Application together with multi-zone lamp module 130 of the present invention (Example given for a four-zone lamp). In its normal use, multi-zone lamp 130 sits above reactor process chamber 126 and is configured to receive multi-point pyrometer light pipes 318 within the module itself. Fiber bundle sensors, FB1, FB2, FB3, and FB4 interface to electrical cables 320, 322, 324, and 326, respectively that provide semiconductor wafer temperature measurements at various points on wafer surface. Output electrical signal 320 corresponding to fiber bundle sensor FB1, goes to PID controller 152. PID controller 152 communicates with process control computer 150 through communication link 328. Temperature sensors FB2, FB3, and FB4 provide measurement signals which are sent via lines 322, 324, and 326 to process control computer 150 (via analog-to-digital converters). In response to signals from PID controller 152 and input lines 322, 324, and 326, process control computer sends power setpoint signals to power supplies, PS1 286, PS2 288, PS3 290, and PS4 292. These power supplies provide adjustable electrical power channels to multi-zone lamp 130 via lines 330, 332, 334, and 336, respectively.

Although FIG. 20 shows four fiber-optic temperature sensors, more than that number is permissible for pyrometric temperature readings of the semiconductor wafer. Moreover, the number of fiber-optic temperature sensors for semiconductor wafer temperature sensing does not have to be equal to the number of power supplies for lamp zones for multi-zone lamp 130. However, sensing of semiconductor wafer temperature with one or more sensors and directly linking those pyrometer measurements to power supply inputs via hardware or software PID controllers is necessary for the real-time control and operation of the system of FIG. 20.

In the operation of the system of FIG. 20, one or more fiber-optic temperature sensors, such as FB1, communicates with computer 150 via PID controller 152. In the preferred embodiment, FB1 associates with the edge zone temperature of semiconductors wafer. In this configuration, the lamp zone with the most number of lamps (i.e., outer zone 264) operates as a master zone that receives control signals from computer 150 via PID controller 152. This creates a master control loop from fiber-optic sensor FB1 to PID controller 152 via line 320. From PID controller 152, signals go via line 328 to process control computer 150. Process control computer 152, in response to signals from PID controller 152, directs the operation of PS4 293 to control the operation of outer lamp zone 264. In the operation of the control system of FIG. 20, power supplies 1, 2, and 3 are slaved to the operation of power supply 4. From the slaved control portion of the FIG. 20 control system, fiber-optic sensors, FB2, FB3, and FB4, send signals via lines 322, 324 and 326, respectively, to process control computer 150.

Based on pre-specified look-up tables stored within the memory of process control computer 150, setpoints for the operation of center lamp zone 270, inner middle zone 268, and outer middle zone 266 are established in real-time. The setpoints are translated to power supply control inputs for PS1, 286, PS2 288, and PS3 290, respectively. Look-up tables within process control computer 150 are accessed according to the master zone setpoint input from PID controller 152. In the system of FIG. 20, although all temperature sensors, FB1 through FB4, are used for semiconductor wafer temperature measurements, the results of the temperature sensors are linked to the master zone sensor or FB1. The dependent power supplies are adjusted based on the pre-selected look-up tables and the sensed temperature from fiber-optic sensor FB1. The system of FIG. 20 provides cylindrically symmetrical temperature uniformity on semiconductor wafer 60 during device fabrication processes and it represents a major improvement over known systems. However, system of FIG. 20 may also require additional look-up tables in order to achieve optimum temperature uniformity during the transient heating or cooling conditions.

FIG. 21 provides an example of a look-up table usable in the preferred embodiment of the master-slaved configuration of FIG. 20. A look-up table may be needed for each set of processing conditions in terms of gas flow rates and process pressures. The steady-state look-up tables may be used for slow transient heat-up/cool-down cycles as well.

Figure 22:
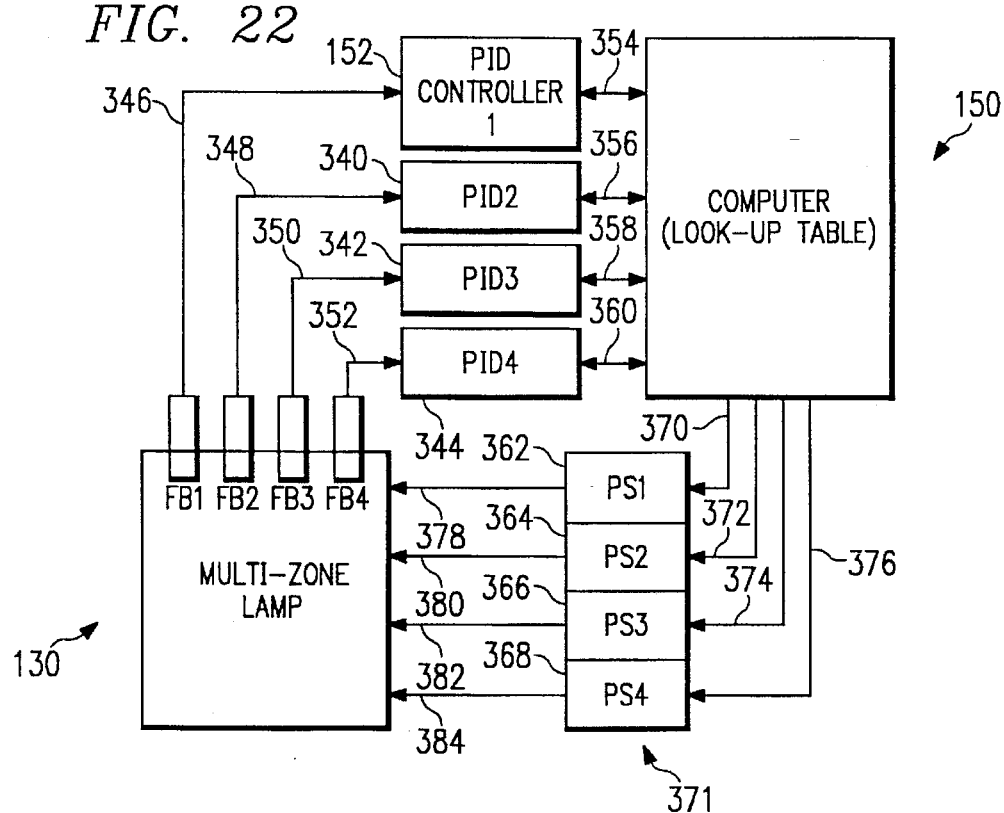
FIG. 22 provides a block diagram of a feedback control network representing an improvement over the network of FIG. 20, that a preferred embodiment of the present invention uses for multi-zone wafer temperature and process uniformity control during wafer processing.

FIG. 22 shows an alternative technique for multi-zone temperature control during steady-state heating and master-slaved control during transient heat-up and cool-down conditions to improve the operation of the control system of FIG. 20. In the configuration of FIG. 22, multi-zone lamp 130 accommodates fiber-optic sensors, FB1, FB2, FB3, and FB4 which provide temperature outputs to PID controllers PID1 152, PID2 340, PID3 342 and PID4 344 via signal links 346, 348, 350 and 352, respectively. The communication links 354, 356, 358 and 360 connect the PID controllers to process control computer 150. Process control computer provides real-time decoupling among various zones and sends suitable control signals to power supplies PS1 362, PS2 364, PS3 366 and PS4 368 via lines 370, 372, 374 and 376, respectively. Output from multi-zone lamp power supplies go through lines 378, 380, 382, and 384 to multi-zone lamp 130.

In the control system of FIG. 22, the four distinct PID controller loops all provide control inputs to process control computer 150. PID controller 1 is associated with fiber-optic temperature sensor FB1 to provide temperature readings from the center of semiconductor wafer 60. In a steady-state heating condition, the multi-zone controller provides real-time control signals to make each of the fiber-optic sensor zones, FB1, FB2, FB3, and FB4 approach or match a desired setpoint temperature and for the best temperature uniformity. The setpoint temperatures will provide to PS1 through PS4 remote control signals to achieve desired steady-state wafer heating conditions. In transient heat-up or cool-down conditions, however, feedback control loops may result in unstable control conditions due to interactions between lamp zones, and prevent independent control of PS1 through PS4 for lamp zones 190–194. In the system of FIG. 22, however, because look-up tables (and master-slaved made of operation) are no longer used in the steady-state condition, more precise dynamic temperature control, and hence more uniform temperature across the wafer results. In order to assure that the overall control system still operates in an acceptable fashion, the response time for PID4 344 can be made shorter than the response time for PID1 152, PID2 340, and PID3 342. PID control signal and power supply settings all come from process control computer 150. In a sense, PID4 still operates to create a master control loop via PS4 during transient operation. However, during steady-state heating conditions, there is closed-loop control of all power supplies resulting in optimum real-time uniformity. This control configuration may employ transient look-up tables similar to FIG. 21.

Figure 23:
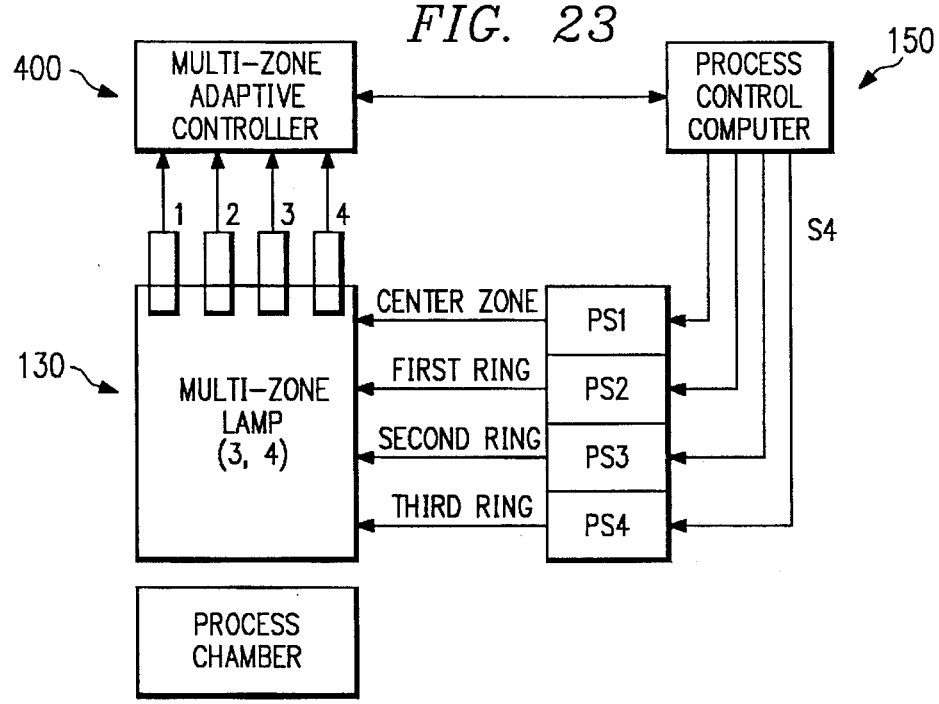
FIG. 23 provides a block diagram to illustrate the operation of yet a further embodiment over the feedback control of that of FIG. 20.

FIG. 23 shows yet a further improvement of the control system established for advanced independent control of the multi-zone lamp 130. Power supplies PS1 through PS4 are individually controlled for each zone within multi-zone lamp. The goal of the real-time multi-zone controller and the goal of previous master-slaved multi-zone controllers is to minimize the temperature non-uniformity across the surface of the wafer. Using process control computer in conjunction with multi-point temperature sensors, and multi-zone lamp 130, the control could be precisely achieved in a real-time system. The system of FIG. 23 provides for independent control of the lamp power supplies so that during both transient and steady state conditions, real-time feedback from fiber-optic sensors FB1 through FB4 can provide input to multi-zone real-time controller 400 and to process control computer 150. Process control computer 150 provides control signals to power supplies PS1–PS4. Multi-zone real-time controller 400 includes an advanced control algorithm based on an empirically determined model of the thermal environment and the interaction among the zones of multi-zone lamp 130. In the system of FIG. 23, the advanced control algorithm calculates necessary control signals for PS1 through PS4 to minimize, in real time, the peak or RMS temperature non-uniformity across the semiconductor wafer surface. As a result, the system of FIG. 23 will provide optimum settings for each power supply. Because each zone has interactions with the other zones (in terms of wafer heating) in multi-zone lamp 130, the multi-zone real-time controller system of FIG. 23 provides the greatest capability and flexibility for temperature uniformity control across the wafer.

Although the present invention and its advantages have been described in detail, it should be understood that various changes, substitutions and alterations can be made herein without departing from the spirit and scope of the invention as defined in the appended claims.

What is claimed is:

1. A method for real-time multi-point semiconductor wafer temperature and process uniformity control, comprising the steps of:

selectively, independently and controllably heating segments of the semiconductor wafer;

independently performing temperature measurements on a plurality of points of the semiconductor wafer;

receiving said temperature measurements and selectively controlling the temperature of the semiconductor wafer to maintain uniformity in said temperature measurements;

said step of selectively controlling the temperature of the semiconductor wafer including heating the semiconductor wafer by directing and reflecting optical energy into a plurality of concentric circular zones, said concentric zones being substantially circularly continuous and sufficiently close to one another to provide a substantially radially continuous flow of optical energy.

2. The method of claim 1, further comprising the step of producing said optical energy with a multi-zone illuminator module having a housing diameter and active optical source diameter larger than the diameter of semiconductor wafer.

3. A method for real-time multi-point semiconductor wafer temperature and process uniformity control, comprising the steps of:

selectively, independently and controllably heating segments of the semiconductor wafer;

independently performing temperature measurements on a plurality of points of the semiconductor wafer;

receiving said temperature measurements and selectively controlling the temperature of the semiconductor wafer to maintain uniformity in said temperature measurements;

said step of independently performing temperature measurements including sensing the semiconductor temperature using a pyrometer, said pyrometer having a plurality of fiber-optic light pipes for communicating temperature-related measurements.

4. The method of claim 1, further comprising the step of providing an approximately continuous circular optical flux from each of said zones at the semiconductor wafer surface using a plurality of point-source lamps associated within each of said circular zones and a single point-source lamp associated with the central zone.

5. The method of claim 1, further comprising the step of using a lamp module comprising two concentric circular zones plus a concentric single-lamp central zone with independent power control capabilities to produce said optical energy.

6. The method of claim 5, wherein the step of using three circular zones comprises the step of directing an outer circular zone of 24 point-source lamps, a middle circular zone of 12 point-source lamps, and a center zone of 1 point-source lamp to produce said optical energy.

7. The method of claim 6, further comprising the step of independently and adjustably providing electrical power to each of said lamp zones.

8. The method of claim 6, further comprising the step of balancing the electrical power distribution to each of said lamps.

9. A method for real-time multi-point semiconductor wafer temperature and process uniformity control, comprising the steps of:

selectively, independently and controllably heating segments of the semiconductor wafer;

independently performing temperature measurements on a plurality of points of the semiconductor wafer;

receiving said temperature measurements and selectively controlling the temperature of the semiconductor wafer to maintain uniformity in said temperature measurements;

said step of independently performing temperature measurements including making real-time, non-invasive, in-situ temperature measurements of the semiconductor wafer by directing a plurality of incident coherent beams of optical energy to the surface of the semiconductor wafer, collecting a plurality of reflected coherent beams of optical energy resulting from the reflection of said plurality of incident coherent beams from the semiconductor wafer, collecting incoherent radiant energy emitted from a plurality of points on a semiconductor wafer, calculating temperature values for the semiconductor wafer as a function of said plurality of incident and reflected coherent beams and said incoherent radiant energy, and associating each of said plurality of incident coherent beams with the reflected coherent beam to yield a beam pair, and further associating each beam pair with the incoherent radiant energy collected from the semi conductor wafer to yield a temperature value for each respective probed point of the semiconductor wafer.

10. A method for real-time multi-point semiconductor wafer temperature and process uniformity control, comprising the steps of:

selectively, independently and controllably heating segments of the semiconductor wafer;

independently performing temperature measurements on a plurality of points of the semiconductor wafer;

receiving said temperature measurements and selectively controlling the temperature of the semiconductor wafer to maintain uniformity in said temperature measurements; and steps for diagnosis and prognosis of semiconductor wafer fabrication processes, the steps for diagnosis and prognosis comprising:

directing coherent electromagnetic energy in the direction of a semiconductor wafer;

measuring the total amount of electromagnetic energy reflected from said semiconductor wafer; and comparing said total reflected electromagnetic energy to a reference value, said reference value comprising an expected value for reflected electromagnetic energy for a given semiconductor wafer surface condition.

11. The method of claim 10, further comprising the step of controlling a semiconductor wafer fabrication process in response to said comparison of said measured total reflectance value to said expected total reflectance value.

12. The method of claim 10, further comprising the steps of:

measuring the amount of electromagnetic energy coherently reflected from the semiconductor wafer;

measuring the amount of electromagnetic energy scatter reflected from the semiconductor wafer; and determining semiconductor surface roughness as a function of said coherent electromagnetic energy, said coherently reflected electromagnetic energy, and said scatter reflected electromagnetic energy.

* * * * *